US011493337B2

(12) United States Patent
Shimada et al.

(10) Patent No.: US 11,493,337 B2
(45) Date of Patent: Nov. 8, 2022

(54) DISTANCE SENSOR, AND METHOD FOR DRIVING DISTANCE SENSOR

(71) Applicant: HAMAMATSU PHOTONICS K.K., Hamamatsu (JP)

(72) Inventors: Akihiro Shimada, Hamamatsu (JP); Mitsuhito Mase, Hamamatsu (JP); Jun Hiramitsu, Hamamatsu (JP); Takashi Suzuki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 1043 days.

(21) Appl. No.: 16/098,187

(22) PCT Filed: Apr. 19, 2017

(86) PCT No.: PCT/JP2017/015746
§ 371 (c)(1),
(2) Date: Nov. 1, 2018

(87) PCT Pub. No.: WO2017/191758
PCT Pub. Date: Nov. 9, 2017

(65) Prior Publication Data
US 2019/0145767 A1 May 16, 2019

(30) Foreign Application Priority Data
May 2, 2016 (JP) .............................. JP2016-092660

(51) Int. Cl.
*G01C 3/06* (2006.01)
*G01S 17/10* (2020.01)
(Continued)

(52) U.S. Cl.
CPC ................ *G01C 3/06* (2013.01); *G01S 7/486* (2013.01); *G01S 17/10* (2013.01); *G01S 17/89* (2013.01);
(Continued)

(58) Field of Classification Search
CPC ......... H01L 27/14625; H01L 27/14609; H01L 27/1461; H01L 27/14612; H01L 27/14623;
(Continued)

(56) References Cited

U.S. PATENT DOCUMENTS 10,224,354 B2 * 3/2019 Mase .................... G01S 7/4915
2004/0021057 A1 2/2004 Drowley

FOREIGN PATENT DOCUMENTS

CN 1976385 A 6/2007
CN 101064791 A 10/2007
(Continued)

OTHER PUBLICATIONS

David Stoppa, "Introduction to 3D Time-of-Flight Image Sensors," European Solid-State Circuits Conference (ESSCIRC), European Solid-State Device Conference (ESSDERC), Sep. 18, 2015, pp. 5-39 (133 pages).
(Continued)

*Primary Examiner* — Tony Ko
(74) *Attorney, Agent, or Firm* — Faegre Drinker Biddle & Reath LLP

(57) ABSTRACT

The present embodiment relates to a distance sensor configured to inject an equal amount of current into storage nodes coupled, respectively, to charge collection regions where charges of a photosensitive region is distributed by driving of first and second transfer electrodes and obtain a distance to an object based on difference information on charge amounts of the respective storage nodes. Saturation caused by disturbance light of each storage node is avoided by injecting the equal amount of current to each storage node, and the difference information on the charge amounts of the respective storage nodes, which is not easily affected by the current injection, is obtained by driving the first and
(Continued)

second transfer electrodes according to the plurality of frames representing the electrode drive pattern, respectively.

12 Claims, 19 Drawing Sheets

(51) Int. Cl.
    *G01S 17/89*     (2020.01)
    *G01S 7/486*     (2020.01)
    *H01L 27/146*     (2006.01)
    *H04N 5/357*     (2011.01)
    *H04N 5/374*     (2011.01)

(52) U.S. Cl.
    CPC ............ *H01L 27/146* (2013.01); *H04N 5/357* (2013.01); *H04N 5/374* (2013.01)

(58) Field of Classification Search
    CPC ......... H01L 27/14627; H01L 27/14629; H01L 27/14641; H01L 27/14645; H01L 27/14621; H01L 27/1463; H01L 27/14605; G01C 3/08; H04N 5/3559; H04N 5/37452; H04N 5/378
    See application file for complete search history.

(56) References Cited

FOREIGN PATENT DOCUMENTS

| | | |
|---|---|---|
| CN | 101688915 A | 3/2010 |
| CN | 102157539 A | 8/2011 |
| CN | 103155150 A | 6/2013 |
| CN | 104160295 A | 11/2014 |
| JP | 2011-133464 A | 7/2011 |
| JP | 2012-215480 A | 11/2012 |
| JP | 2013-76645 A | 4/2013 |
| JP | 2014-169921 A | 9/2014 |
| JP | 2015-232452 A | 12/2015 |
| JP | 2017-116314 A | 6/2017 |
| KR | 1020130045833 A | 5/2013 |
| KR | 1020150079545 A | 7/2015 |
| TW | 201423965 A | 6/2014 |
| WO | WO-2017/022220 A1 | 2/2017 |

OTHER PUBLICATIONS

International Preliminary Report on Patentability dated Nov. 15, 2018 for PCT/JP2017/015746.

* cited by examiner

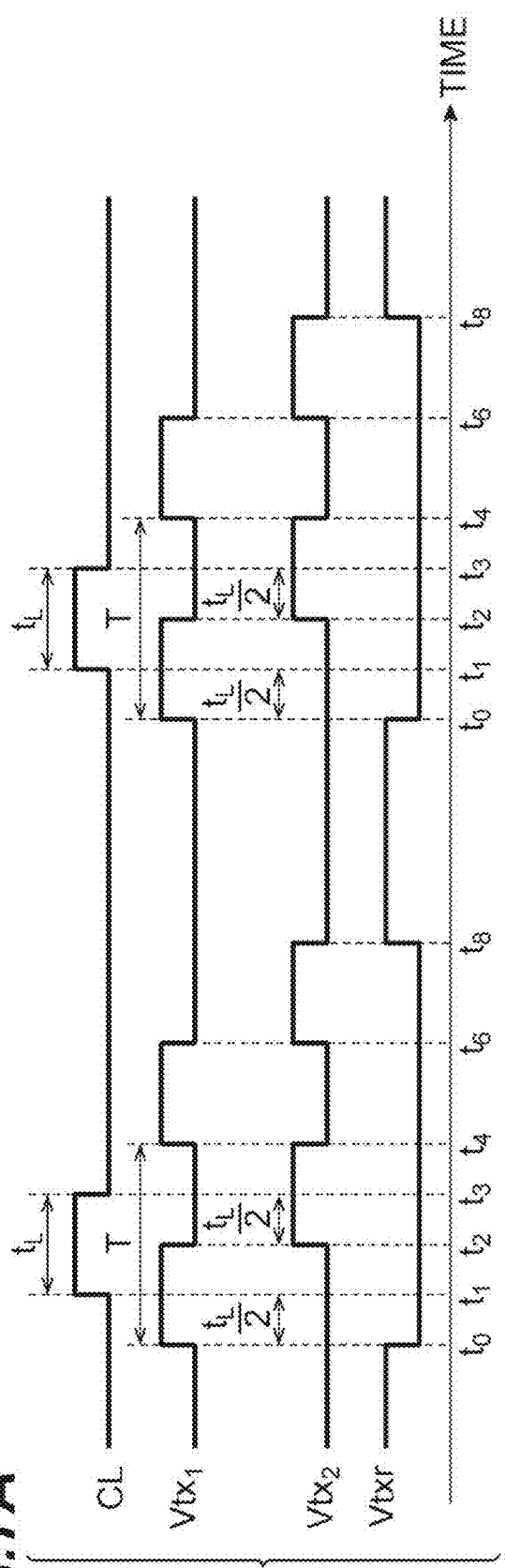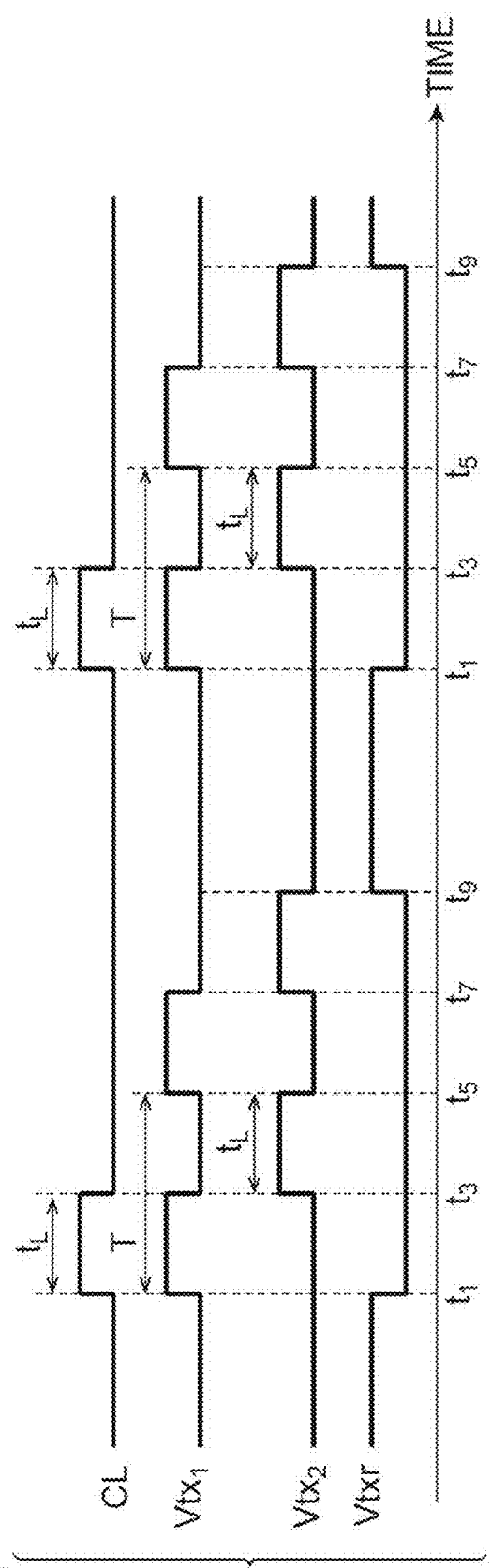

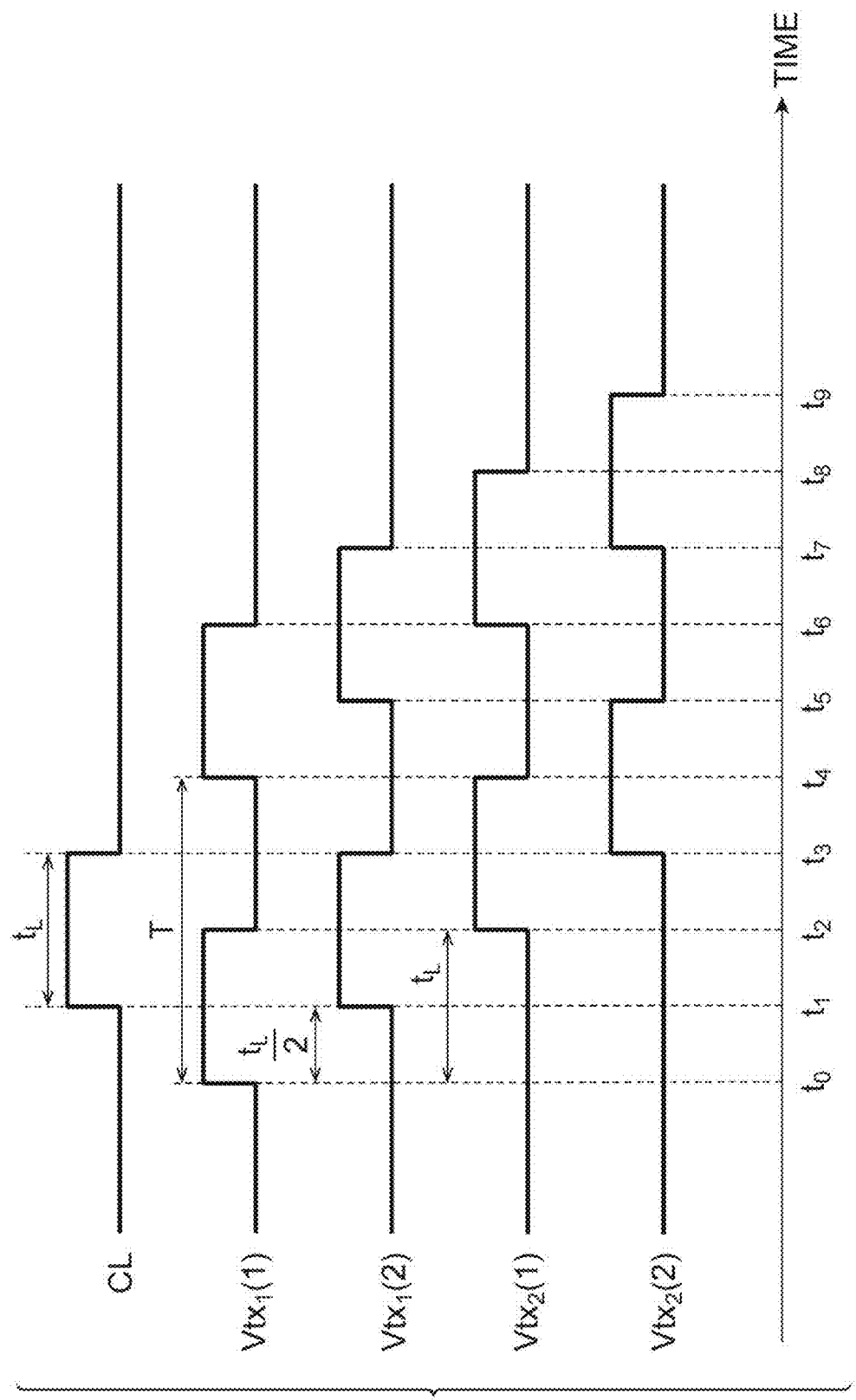

*Fig.11A*
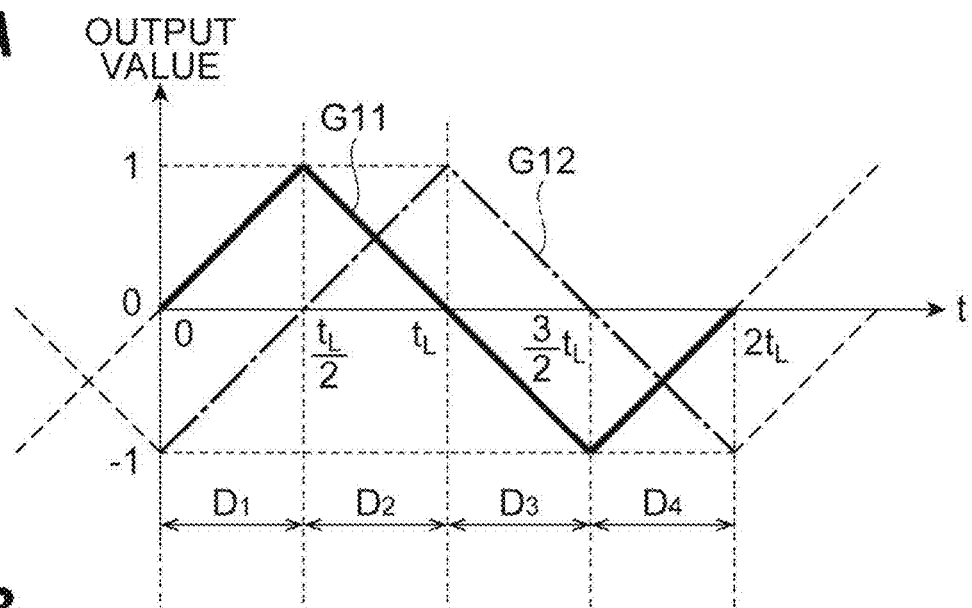
*Fig.11B*
*Fig.11C*
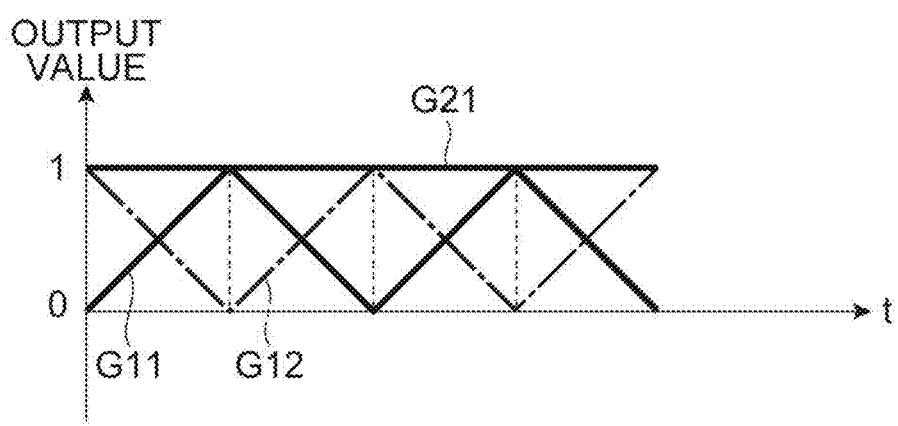

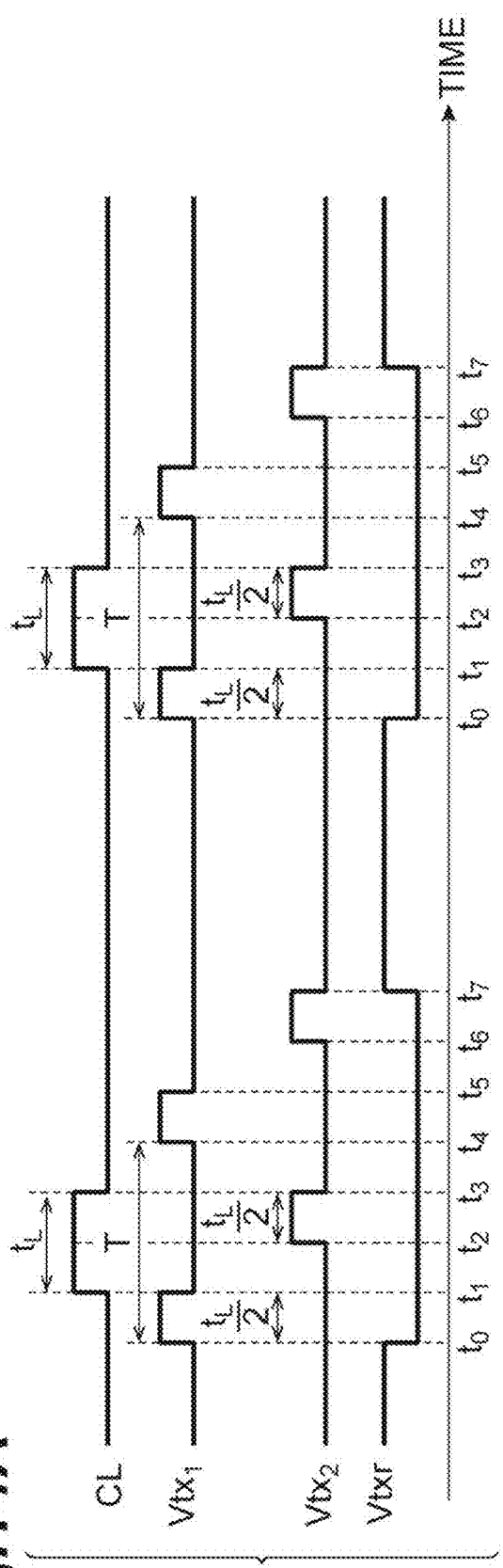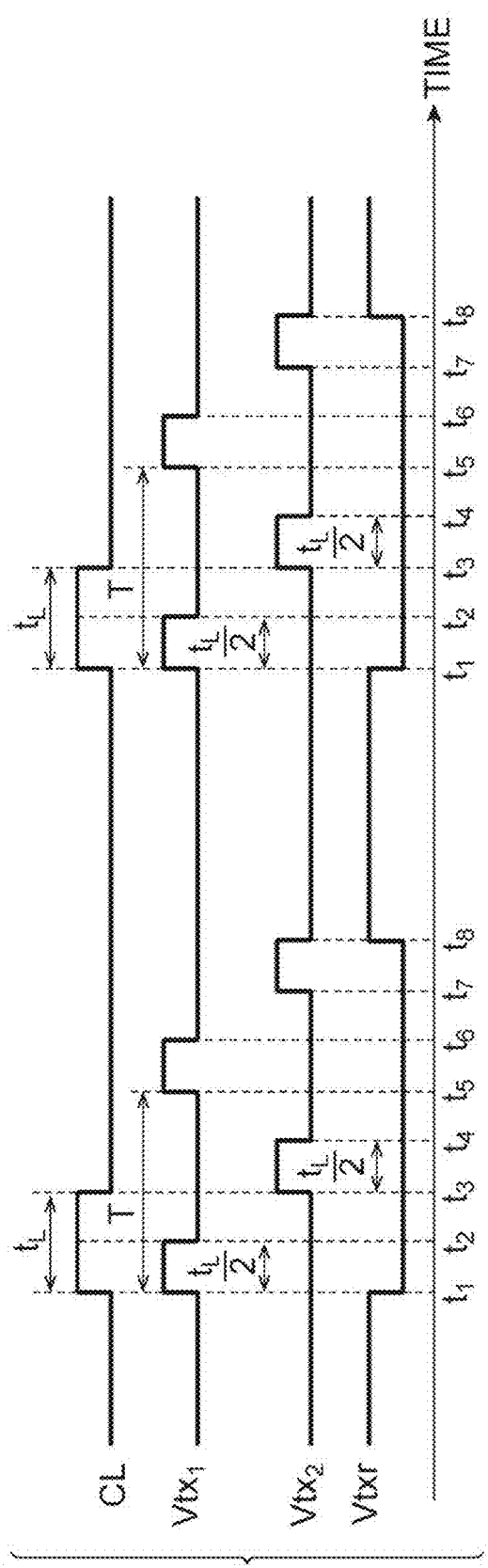

DISTANCE SENSOR, AND METHOD FOR DRIVING DISTANCE SENSOR

TECHNICAL FIELD

The present invention relates to a distance sensor and a driving method for a distance sensor.

BACKGROUND ART

A time-of-flight (TOF) method for measuring a distance to an object based on a time difference between a timing of emitting light from a light source and a timing when reflected light from the object reaches has been known. For example, the following Patent Document 1 describes a distance sensor based on a TOF method. The distance sensor disclosed in Patent Document 1 has a charge distribution type configuration in which charges generated during a first period after irradiation of pulsed light and charges generated during a second period after the first period are stored in storage nodes coupled to different charge collection regions, respectively. Then, the distance to the object is calculated based on a ratio of charge amounts stored in these storage nodes.

In addition, Non Patent Document 1 describes a method for measuring a distance to an object based on a phase difference between irradiation light and reflected light thereof by emitting triangular wave light.

CITATION LIST

Patent Literature

Patent Document 1: Japanese Unexamined Patent Publication No. 2011-133464

Non Patent Literature

Non Patent Document 1: David Stoppa et al., Introduction to 3D Time-of-Fight Image Sensors, European Solid-State Circuits Conference (ESSCIRC), European Solid-State Device Conference (ESSDERC), 2015

SUMMARY OF INVENTION

Technical Problem

As a result of examining the above related art, the inventors have found out the following problems. That is, generally, in the distance sensor, not only charges caused by the reflected light but also charges caused by disturbance light are stored in the storage node. In the distance sensor described in Patent Document 1, a charge amount corresponding to the disturbance light is subtracted from the charge amount obtained in each of the storage nodes when calculating the distance. Therefore, both the charges caused by the reflected light and the charges caused by the disturbance light are stored in each of the storage nodes so that there is a problem that the storage node is easily saturated. Incidentally, the pulsed light is output in the method described in Patent Document 1, and thus, there is an advantage that it is possible to increase an intensity of the irradiation light with respect to an intensity of the disturbance light (that is, an S/N ratio).

In addition, the object is irradiated with the triangular wave light in the method described in Non Patent Document 1, and thus, it is necessary to set any transfer electrode constantly to an on-potential (potential that enables charge transfer) during one cycle in order to take all charges generated during the one cycle. In this case, a large amount of charge caused by disturbance light is taken so that each storage node is easily saturated. In addition, a light emission state of a light source is continuous as compared with the case where the pulsed light is output, and thus, there is a problem that an intensity of irradiation light is suppressed to be low, and the intensity of the irradiation light with respect to an intensity of the disturbance light (that is, an S/N ratio) is low.

Here, it is conceivable to inject current into each storage node to offset charges in order to avoid saturation of a storage node. In such a system, it is necessary to perform the current injection in a state where an intensity of disturbance light is unknown, and thus, it is desirable to inject an equal amount of current to each storage node and obtain a distance to an object based on a difference in charge amount stored in each storage node. This is because the difference in the charge amount is not affected by the injected current. However, it is difficult for the distance sensors described in Patent Literature 1 and Non Patent Literature 1 to be used in such a method.

The present invention has been made to solve the above-described problems, and an object thereof is to provide a distance sensor and a driving method for a distance sensor having a structure that enables injection of an equal amount of current into storage nodes electrically coupled, respectively, to charge collection regions where charges of a photosensitive region is distributed by driving of a plurality of transfer electrodes and obtaining of a distance to an object based on difference information on charge amounts of the respective storage nodes.

Solution to Problem

A distance sensor according to the present embodiment is a distance sensor configured to irradiate an object with light and measure a distance to the object by detecting reflected light from the object, and as an aspect thereof, comprises a light irradiation unit, a semiconductor substrate, a first transfer electrode, a second transfer electrode, and a drive unit. The light irradiation unit repeatedly irradiates the object with pulsed light. The semiconductor substrate has a photosensitive region and first and second charge collection regions. The photosensitive region is a region that generates charges corresponding to a light amount of the reflected light. Each of the first and second charge collection regions is a region that is disposed in a state of being separated from the photosensitive region by a predetermined distance and collects the charges from the photosensitive region. The first transfer electrode is an electrode that is disposed on a region between the photosensitive region and the first charge collection region and can be set to an on-potential or an off-potential. Here, the on-potential is a potential that enables charge transfer from the photosensitive region to the first charge collection region, and the off-potential is a potential that stops this charge transfer. The second transfer electrode is disposed on a region between the photosensitive region and the second charge collection region, and is a potential that enables charge transfer from the photosensitive region to the second charge collection region, and the off-potential is a potential to stop this charge transfer. The drive unit sequentially executes a plurality of frames, each of which forms an electrode drive pattern for driving the first and second transfer electrodes and is defined by equally-spaced times $t_0, t_1, \ldots,$ and $t_9$, and drives the first and second transfer electrodes. In the configuration as described above, the light irradiation unit emits light for times $t_1$ to $t_3$ in each of the plurality of frames. In addition, in a first frame among the plurality of frames, the drive unit sets the first transfer electrode to the on-potential between the times $t_0$ and $t_2$ and between the times $t_4$ and $t_6$, and sets the second transfer electrode to the on-potential between the times $t_2$ and $t_4$ and between the times $t_6$ and $t_8$. Further, in a second frame different from the first frame, the drive unit sets the first transfer electrode to the on-potential between the times $t_1$ and $t_3$ and between the times $t_5$ and $t_7$, and sets the second transfer electrode to the on-potential between the times $t_3$ and $t_5$ and between the times $t_7$ and $t_9$.

Advantageous Effects of Invention

The distance sensor according to the present embodiment is the distance sensor configured to irradiate the object with the pulsed light, and has the structure for injecting the equal amount of current into the storage nodes electrically coupled, respectively, to the charge collection regions where the charges of the photosensitive region is distributed by driving of the plurality of transfer electrodes and obtaining of the distance to the object based on the difference information on the charge amounts of the respective storage nodes. Thus, according to the distance sensor and the driving method for the distance sensor, saturation caused by disturbance light of each storage node is avoided by injecting the equal amount of current to each storage node, and the difference information on the charge amounts of the respective storage nodes, which is not easily affected by the current injection, is obtained by driving the first and second transfer electrodes according to the plurality of frames representing the electrode drive pattern, respectively.

BRIEF DESCRIPTION OF DRAWINGS

FIG. 7A is a timing chart illustrating operations of transfer electrodes in a storage frame of a first frame, and FIG. 7B is a timing chart illustrating operations of the transfer electrodes in a storage frame of a second frame.

FIG. 8 is a view illustrating timing charts of the first frame and the second frame for one-time driving clock in an overlapping manner.

FIG. 11A is a graph illustrating a relationship between an output value from each pixel and a time from irradiation of light to incidence of reflected light, FIG. 11B is a chart illustrating signs of output values in the first frame and the second frame, and FIG. 11C is a view illustrating a method for calculating a total charge amount.

FIGS. 14A and 14B are views illustrating a timing chart of a driving method according to a first modification.

DESCRIPTION OF EMBODIMENTS

Figure 1:
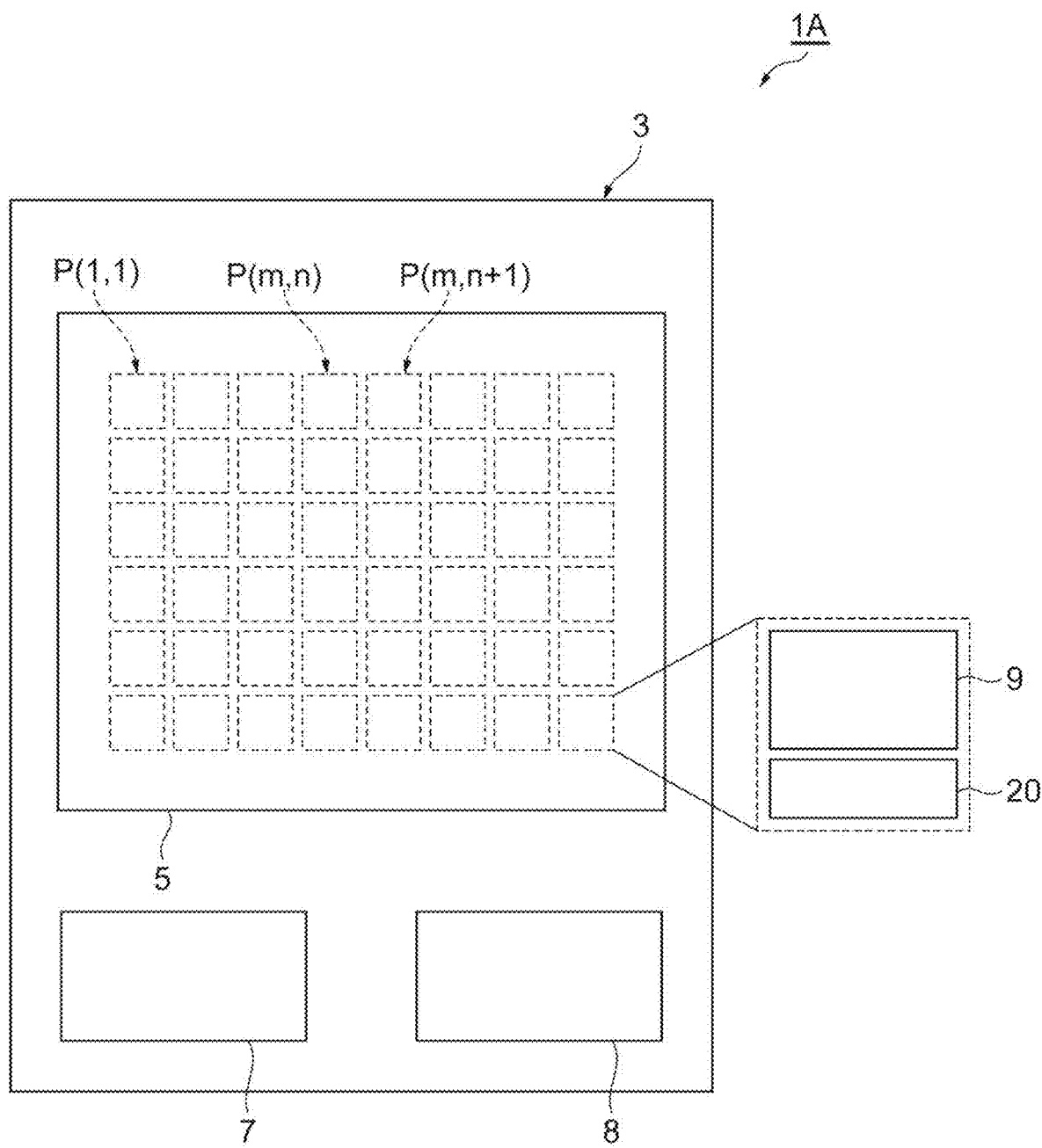
FIG. 1 is a plan view illustrating a configuration of a distance sensor according to an embodiment of the present invention.

Description of Embodiments of Invention of Present Application

First, ones corresponding to embodiments of the invention of the present application will be individually listed and described.

(1) A distance sensor according to the present embodiment is a distance sensor configured to irradiate an object with light and measure a distance to the object by detecting reflected light from the object, and as an aspect thereof, comprises a light irradiation unit, a semiconductor substrate, a first transfer electrode, a second transfer electrode, and a drive unit. The light irradiation unit repeatedly irradiates the object with pulsed light. The semiconductor substrate has a photosensitive region, and first and second charge collection regions. The photosensitive region is a region that generates charges corresponding to a light amount of the reflected light. Each of the first and second charge collection regions is a region that is disposed in a state of being separated from the photosensitive region by a predetermined distance and collects the charges from the photosensitive region. The first transfer electrode is an electrode that is disposed on a region between the photosensitive region and the first charge collection region, and can be set to an on-potential or an off-potential. Here, the on-potential is a potential that enables charge transfer from the photosensitive region to the first charge collection region, and the off-potential is a potential that stops this charge transfer. The second transfer electrode is disposed on a region between the photosensitive region and the second charge collection region, the on-potential is a potential that enables charge transfer from the photosensitive region to the second charge collection region, and the off-potential is a potential to stop this charge transfer. The drive unit sequentially executes a plurality of frames, each of which forms an electrode drive pattern for driving the first and second transfer electrodes and is defined by equally-spaced times $t_0, t_1, \ldots,$ and $t_9$, and drives the first and second transfer electrodes. In the configuration as described above, the light irradiation unit emits light for times $t_1$ to $t_3$ in each of the plurality of frames. In addition, in a first frame among the plurality of frames, the drive unit sets the first transfer electrode to the on-potential between the times $t_0$ and $t_2$ and between the times $t_4$ and $t_6$, while setting the second transfer electrode to the on-potential between the times $t_2$ and $t_4$ and between the times $t_6$ and $t_8$. Further, in a second frame different from the first frame, the drive unit sets the first transfer electrode to the on-potential between the times $t_1$ and $t_3$ and between the times $t_5$ and $t_7$, while setting the second transfer electrode to the on-potential between the times $t_3$ and $t_5$ and between the times $t_7$ and $t_9$.

(2) As one aspect of the present embodiment, the drive unit of the distance sensor may sequentially execute a plurality of frames, each of which forms an electrode drive pattern for driving the first and second transfer electrodes and is defined by equally-spaced times to, $t_1$, ..., and $t_8$, to drive the first and second transfer electrodes. In this case, the light irradiation unit irradiates the plurality of frames with light, respectively, for times $t_1$ to $t_3$. In addition, in a first frame among the plurality of frames, the drive unit sets the first transfer electrode to the on-potential between the times $t_0$ and $t_1$ and between the times $t_4$ and $t_5$, while setting the second transfer electrode to the on-potential between the times $t_2$ and $t_3$ and between the times $t_6$ and $t_7$. Further, in a second frame different from the first frame, the drive unit sets the first transfer electrode to the on-potential between the times $t_1$ and $t_2$ and between the times $t_5$ and $t_6$, while setting the second transfer electrode to the on-potential between the times $t_3$ and $t_4$ and between the times $t_7$ and $t_8$.

(3) As one embodiment of the present embodiment, the distance sensor may include a light irradiation unit, a semiconductor substrate, first to fourth transfer electrodes, and a drive unit. The light irradiation unit repeatedly irradiates the object with pulsed light. The semiconductor substrate has a photosensitive region, and first to fourth charge collection regions. Here, the photosensitive region generates charges corresponding to a light amount of the reflected light. Each of the first to fourth charge collection regions is disposed in a state of being separated from the photosensitive region by a predetermined distance and collects the charges from the photosensitive region. The first transfer electrode is disposed on a region between the photosensitive region and the first charge collection region, the second transfer electrode is disposed on a region between the photosensitive region and the second charge collection region, the third transfer electrode is disposed on a region between the photosensitive region and the third charge collection region, and the fourth transfer electrode is disposed on a region between the photosensitive region and the fourth charge collection region. Each of the first to fourth transfer electrodes can be set to an on-potential that enables charge transfer from the photosensitive region to the corresponding charge collection region or an off-potential that stops this charge transfer. The drive unit sequentially executes a plurality of frames, each of which forms an electrode drive pattern for driving the first to fourth transfer electrodes and is defined by equally-spaced times $t_0$, $t_1$, ..., and $t_8$, to drive the first to fourth transfer electrodes. In the configuration as described above, the light irradiation unit emits light for times $t_1$ to $t_3$ in each of the plurality of frames. In each of the plurality of frames, the drive unit sets the first transfer electrode to the on-potential between the times to and $t_1$ and between the times $t_4$ and $t_5$, sets the second transfer electrode to the on-potential between the times $t_1$ and $t_2$ and between the times $t_5$ and $t_6$, sets the third transfer electrode to the on-potential between the times $t_2$ and $t_3$ and between the times $t_6$ and $t_7$, and sets the fourth transfer electrode to the on-potential between the times $t_3$ and $t_4$ and between the times $t_7$ and $t_8$.

(4) In a method for driving a distance sensor according to the present embodiment, a distance sensor, configured to irradiate an object with light and measure a distance to an object by detecting reflected light from the object, is driven. The distance sensor to be driven includes a light irradiation unit, a semiconductor substrate, a first transfer electrode, and a second transfer electrode. The light irradiation unit repeatedly irradiates the object with pulsed light. The semiconductor substrate has a photosensitive region, and first and second charge collection regions. The photosensitive region is a region that generates charges corresponding to a light amount of the reflected light. Each of the first and second charge collection regions is a region that is disposed in a state of being separated from the photosensitive region by a predetermined distance and collects the charges from the photosensitive region. The first transfer electrode is an electrode that is disposed on a region between the photosensitive region and the first charge collection region, and can be set to an on-potential or an off-potential. Here, the on-potential is a potential that enables charge transfer from the photosensitive region to the first charge collection region, and the off-potential is a potential that stops this charge transfer. The second transfer electrode is disposed on a region between the photosensitive region and the second charge collection region, the on-potential is a potential that enables charge transfer from the photosensitive region to the second charge collection region, and the off-potential is a potential to stop this charge transfer. In one aspect of the driving method, a plurality of frames, each of which forms an electrode drive pattern for driving the first and second transfer electrodes and is defined by equally-spaced times $t_0$, $t_1$, ..., and $t_9$, is sequentially executed. Specifically, light is emitted from the light irradiation unit for the times $t_1$ to $t_3$ in each of the plurality of frames in the driving method. In addition, in a first frame among the plurality of frames, the first transfer electrode is set to the on-potential between the times $t_0$ and $t_2$ and between the times $t_4$ and $t_6$, and the second transfer electrode is set to the on-potential between the times $t_2$ and $t_4$ and between the times $t_6$ and $t_8$, in the driving method. Further, in a second frame different from the first frame, the first transfer electrode is set to the on-potential between the times $t_1$ and $t_3$ and between the times $t_5$ and $t_7$, and the second transfer electrode is set to the on-potential between the times $t_3$ and $t_5$ and between the times $t_7$ and $t_9$, in the driving method.

(5) As one aspect of the present embodiment, in the driving method, the distance sensor having the above structure may be set as an object to be driven, and a plurality of frames, each of which forms an electrode drive pattern for driving the first and second transfer electrodes and is defined by equally-spaced times $t_0$, $t_1$, ..., and $t_8$, may be sequentially executed. In this case, in each of the plurality of frames, light is emitted from the light irradiation unit for the times $t_1$ to $t_3$ of each frame in the driving method. In addition, in a first frame among the plurality of frames, the first transfer electrode is set to the on-potential between the times $t_0$ and $t_1$ and between the times $t_4$ and $t_5$, and the second transfer electrode is set to the on-potential between the times $t_2$ and $t_3$ and between the times $t_6$ and $t_7$, in the driving method. Further, in a second frame different from the first frame, the first transfer electrode is set to the on-potential between the times $t_1$ and $t_2$ and between the times $t_5$ and $t_6$, and the second transfer electrode is set to the on-potential between the times $t_3$ and $t_4$ and between the times $t_7$ and $t_8$ in the driving method.

(6) As one aspect of the present embodiment, the distance sensor as the object to be driven of the driving method may include a light irradiation unit, a semiconductor substrate, and first to fourth transfer electrodes. The light irradiation unit repeatedly irradiates the object with pulsed light. The semiconductor substrate has a photosensitive region, and first to fourth charge collection regions. Here, the photosensitive region generates charges corresponding to a light amount of the reflected light. Each of the first to fourth charge collection regions is disposed in a state of being separated from the photosensitive region by a predetermined distance and collects the charges from the photosensitive region. The first transfer electrode is disposed on a region between the photosensitive region and the first charge collection region, the second transfer electrode is disposed on a region between the photosensitive region and the second charge collection region, the third transfer electrode is disposed on a region between the photosensitive region and the third charge collection region, and the fourth transfer electrode is disposed on a region between the photosensitive region and the fourth charge collection region. Each of the first to fourth transfer electrodes can be set to an on-potential that enables charge transfer from the photosensitive region to the corresponding charge collection region or an off-potential that stops this charge transfer. In the driving method with the distance sensor having the above structure set as the object to be driven, a plurality of frames, each of which forms an electrode drive pattern for driving the first to fourth transfer electrodes and is defined by equally-spaced times $t_0, t_1, \ldots,$ and $t_8$, is sequentially executed. Specifically, in the driving method, light is emitted from the light irradiation unit for the times $t_1$ to $t_3$, the first transfer electrode is set to the on-potential between the times $t_0$ and $t_1$ and between the times $t_4$ and $t_5$, the second transfer electrode is set to the on-potential between the times $t_1$ and $t_2$ and between the times $t_5$ and $t_6$, the third transfer electrode is set to the on-potential between the times $t_2$ and $t_3$ and between the times $t_6$ and $t_7$, and the fourth transfer electrode is set to the on-potential between the times $t_3$ and $t_4$ and between the times $t_7$ and $t_8$, in each of the plurality of frames.

(7) According to the distance sensor and the driving method of each of the various aspects described above, it is possible to obtain the distance based on a difference of the amount of the charges stored in each storage node as described in the embodiments to be described later. Therefore, it is possible to avoid saturation of each storage node by injecting an equal amount of current to each storage node.

(8) As one aspect of each of the distance sensor and the driving method thereof according to the present embodiments, the semiconductor substrate may further include a fifth charge collection region disposed in a state of being separated from a photosensitive region by a predetermined distance and configured to collect charges from the photosensitive region, and the distance sensor may further include a fifth transfer electrode disposed on a region between the photosensitive region and the fifth charge collection region corresponding to this configuration. In this case, in the distance sensor, the drive unit sets the fifth transfer electrode to an on-potential except for a period during which the other transfer electrodes are initially set to the on-potential and then finally set to the off-potential. Meanwhile, in the driving method, the fifth transfer electrode is set to the on-potential except for the period during which the other transfer electrodes are initially set to the on-potential and then finally set to the off-potential.

(9) According to the distance sensor and the driving method of each of the various aspects described above, it is possible to discharge charges generated by disturbance light using the fifth transfer electrode except for a period during which the first and second transfer electrodes (or the first to fourth transfer electrodes) are driven. Therefore, it is possible to further suppress saturation caused by the disturbance light and reduce shot noise caused by the disturbance light, and thus, it is possible to further improve a resistance against the disturbance light and distance measurement accuracy.

As described above, each aspect listed in [Description of Embodiment of Invention of Present Application] can be applied to each of the remaining aspects or to all the combinations of these remaining aspects.

Details of Embodiment of Invention of Present Application

Hereinafter, a specific structure of the distance sensor and the method for driving the distance sensor according to the present embodiments will be described in detail with reference to the attached drawings. Incidentally, the invention is not limited to these various examples, but is illustrated by the claims, and any modification within the equivalent meaning and the equivalent scope of the claims is intended to be included therein. In addition, in the description of the drawings, the same elements will be denoted by the same reference signs, and redundant descriptions thereof will be omitted.

FIG. 1 is a plan view illustrating a configuration of a distance sensor 1A according to an embodiment of the present invention. The distance sensor 1A measures a distance to an object by irradiating the object with light and detecting reflected light from the object. As illustrated in FIG. 1, the distance sensor 1A includes an imaging region 5 formed on a semiconductor substrate 3, a sensor drive circuit 7 (drive unit), and a processing circuit 8. The sensor drive circuit 7 drives the imaging region 5. The processing circuit 8 processes an output of the imaging region 5. The imaging region 5 has a plurality of pixels P disposed one-dimensionally or two-dimensionally on the semiconductor substrate 3. In FIG. 1, pixels P (m, n) in m rows and n columns are illustrated (m and n are natural numbers). Each of the pixels P (m, n) includes a light receiving unit 9 and a current injection circuit 20. The imaging region 5 detects the reflected light from the object for each of the pixels P. Then, the distance for each of the pixels P of the image of the object is obtained by obtaining the time from the irradiation of the light to the arrival of the reflected light for each of the pixels P. The distance sensor 1A is a charge distribution type distance sensor, and obtains the time from the irradiation of light to the arrival of the reflected light in accordance with a ratio of charge amounts distributed to two positions within each of the pixels P.

Figure 2:
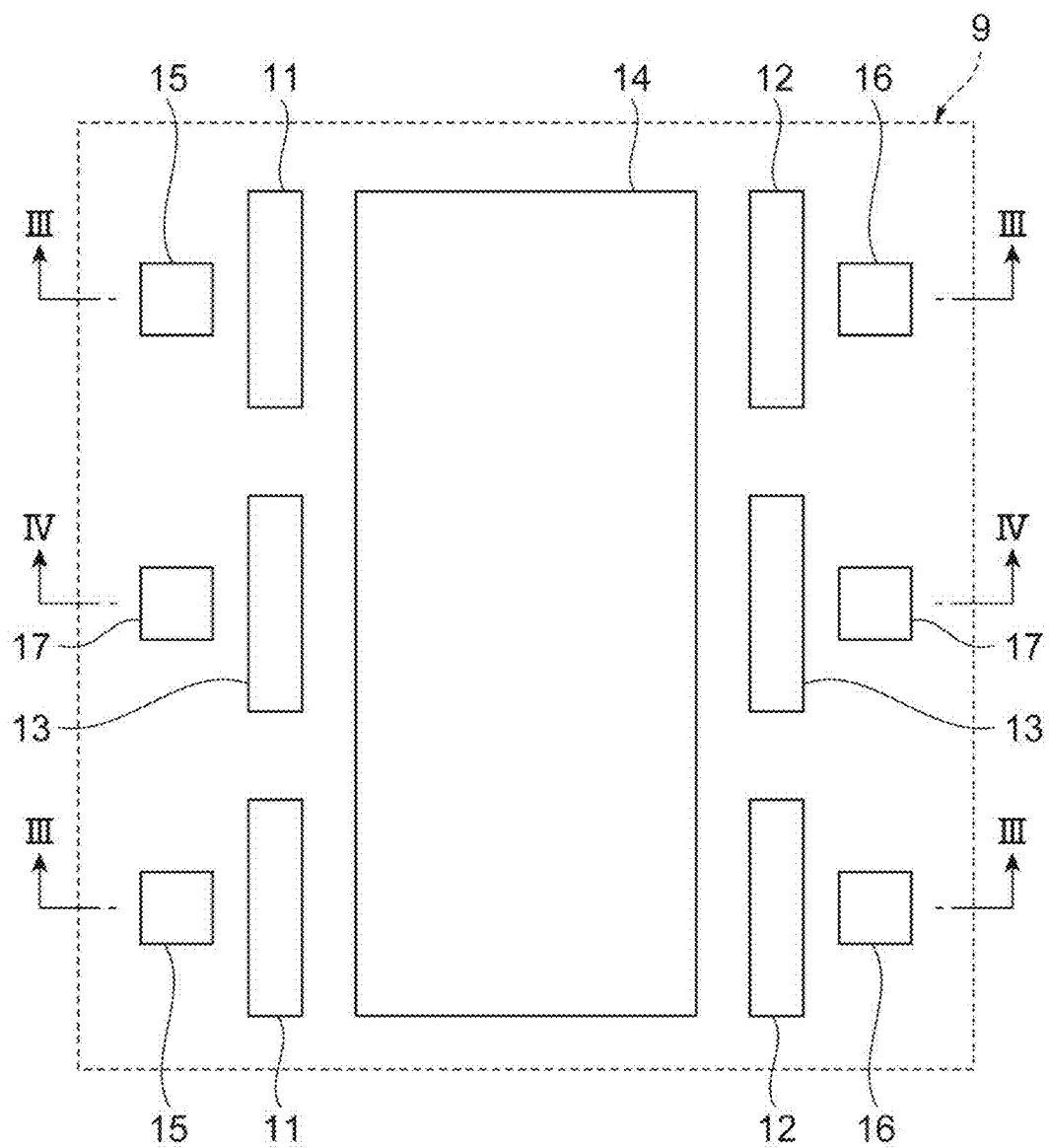
FIG. 2 is a plan view of a light receiving unit of each pixel of the distance sensor illustrated in FIG. 1.
Figure 3:
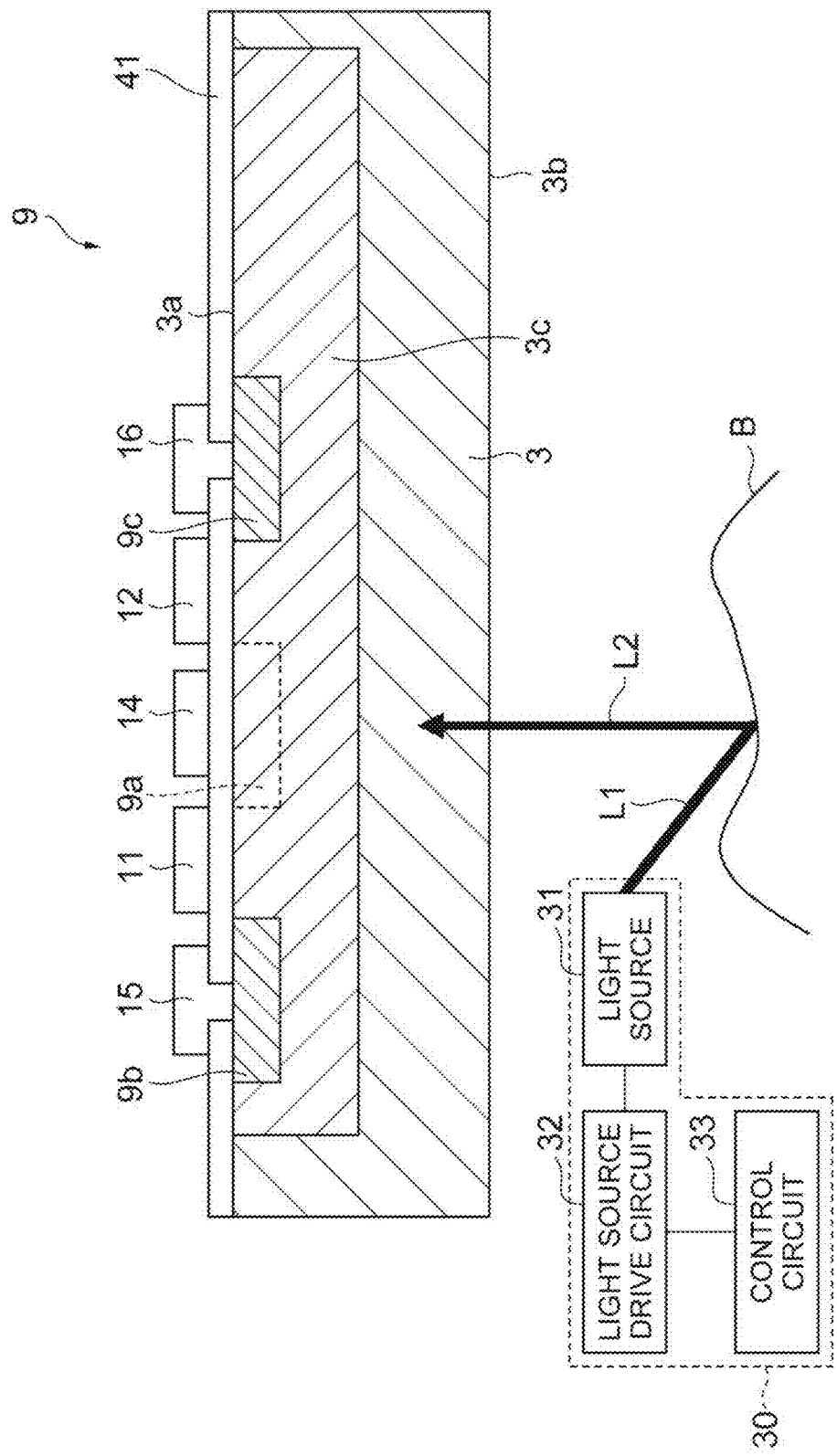
FIG. 3 is a cross-sectional view taken along a line I-III of FIG. 2.
Figure 4:
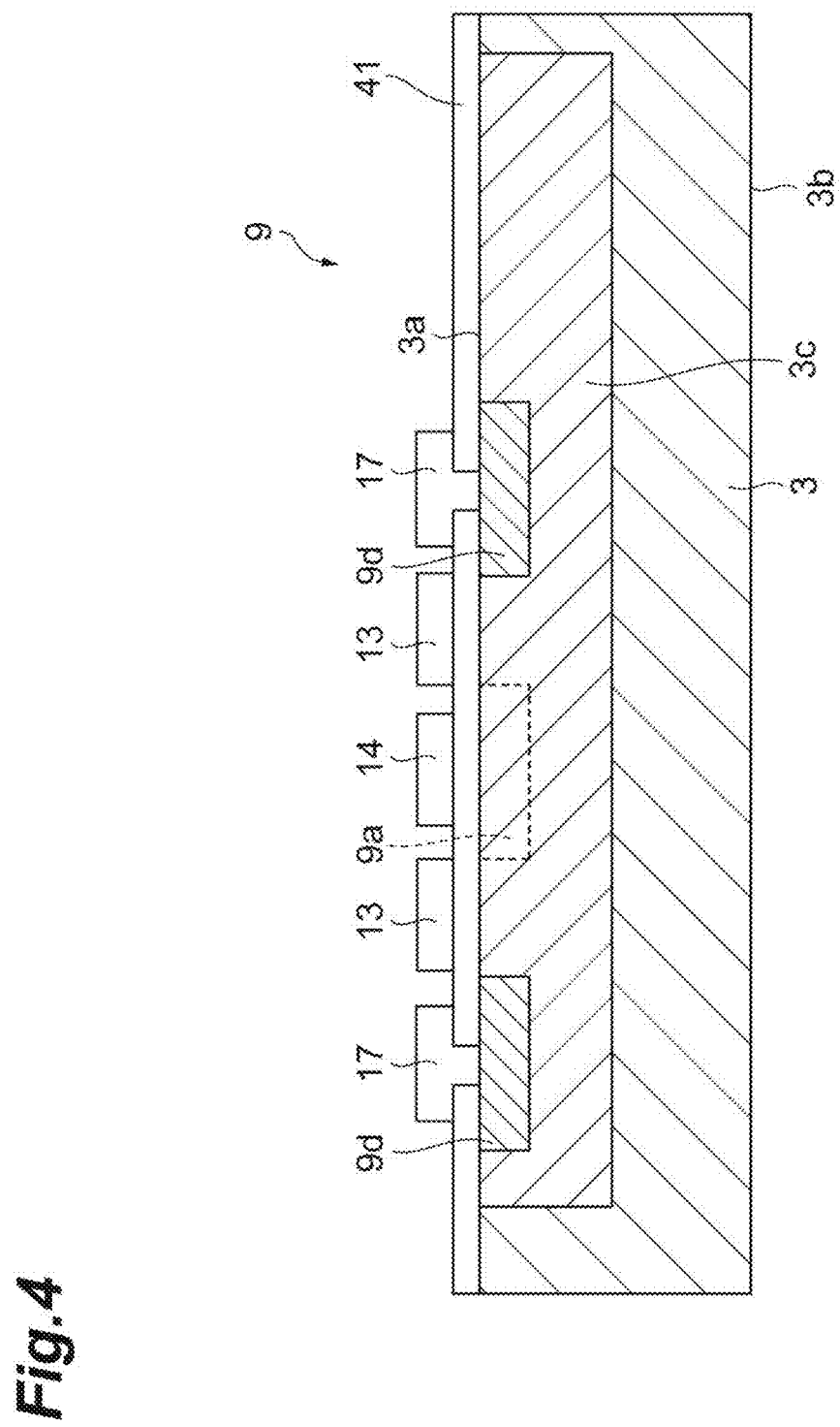
FIG. 4 is a cross-sectional view taken along a line IV-IV of FIG. 2.

FIG. 2 is a plan view of the light receiving unit 9 of each of the pixels P (m, n) of the distance sensor 1A illustrated in FIG. 1. FIGS. 3 and 4 are cross-sectional views taken along a line III-III and a line IV-IV of FIG. 2, respectively, and illustrate cross sectional configurations of the light receiving unit 9. In addition, FIG. 3 also illustrates a light source unit 30.

As illustrated in FIG. 2, the light receiving unit 9 of the present embodiment includes a transfer electrode 11 (first transfer electrode), a transfer electrode 12 (second transfer electrode), a transfer electrode 13 (fifth transfer electrode), a photogate electrode 14, signal extraction electrodes 15 and 16, and a charge discharging electrode 17. In FIG. 2, the number of each of the transfer electrodes 11 and 12 and the signal extraction electrodes 15 and 16 is two, but may be one. In FIG. 2, the number of each of the transfer electrode 13 and the charge discharging electrode 17 is two, but may be one.

As illustrated in FIG. 3, the light receiving unit 9 further has a photosensitive region 9a, a charge collection region 9b (first charge collection region), and a charge collection region 9c (second charge collection region). The photosensitive region 9a receives reflected light L2 and generates charges corresponding to the light amount. The charge collection regions 9b and 9c are disposed so as to be adjacent to the photosensitive region 9a in a state of sandwiching the photosensitive region 9a. Each of the charge collection regions 9b and 9c collects charges from the photosensitive region 9a so that the charges are stored in each storage node coupled thereto. Incidentally, the photosensitive region 9a is disposed between the charge collection regions 9b and 9c in FIG. 3, but the charge collection regions 9b and 9c may be adjacent to one side of the photosensitive region 9a, and there is no restriction on a positional relationship therebetween.

Specifically, the semiconductor substrate 3 is made of a high-concentration p-type (second conductivity type) semiconductor, and the light receiving unit 9 of each of the pixels P (m, n) has a low-concentration p-type (second conductivity type) surface region 3c provided on a surface 3a side of the semiconductor substrate 3. In addition, an insulating layer 41 is formed on the surface 3a of the semiconductor substrate 3, and the photogate electrode 14 is formed on the surface region 3c between the charge collection regions 9b and 9c with the insulating layer 41 interposed therebetween. A region inside the surface region 3c positioned immediately below the photogate electrode 14 is the photosensitive region 9a. A potential of the photosensitive region 9a is controlled by a voltage applied to the photogate electrode 14. A slight positive DC voltage is applied to the photogate electrode 14 as necessary. As a result, hole-electron pairs are generated in response to incidence of light to the photosensitive region 9a.

The charge collection regions 9b and 9c are high-concentration n-type (first conductivity type) regions formed on the surface region 3c side of the semiconductor substrate 3. The charge collection regions 9b and 9c are also referred to as floating diffusion regions or charge storage regions. An n-type semiconductor has electrons as carriers in an electrically-neutral state, and is ionized positively in the case of missing the carriers. That is, each band structure of the high-concentration n-type charge collection regions 9b and 9c has a shape greatly recessed downward and forms a potential well. The signal extraction electrode 15 is formed on the charge collection region 9b, and the signal extraction electrode 16 is formed on the charge collection region 9c. The signal extraction electrodes 15 and 16 are in contact with the charge collection regions 9b and 9c, respectively, through openings formed in the insulating layer 41.

The transfer electrode 11 is disposed on a region between the photosensitive region 9a and the charge collection region 9b. The transfer electrode 12 is disposed on a region between the photosensitive region 9a and the charge collection region 9c. When a positive potential (on-potential) is applied to the transfer electrode 11, a potential of the region immediately below the transfer electrode 11 has an intermediate magnitude between a potential of the photosensitive region 9a and a potential of the charge collection region 9b. In this manner, potential steps from the photosensitive region 9a to the charge collection region 9b are formed, and electrons fall into the potential well of the charge collection region 9b (the charges are stored in the well). Similarly, when a positive potential (on-potential) is applied to the transfer electrode 12, a potential of the region immediately below the transfer electrode 12 has an intermediate magnitude between the potential of the photosensitive region 9a and a potential of the charge collection region 9c. Therefore, potential steps from the photosensitive region 9a to the charge collection region 9c are formed, and electrons fall into the potential well of the charge collection region 9c.

Incidentally, the structure of providing the signal extraction electrodes 15 and 16 on the charge collection regions 9b and 9c to extract signals is adopted in the present embodiment, but it is also possible to separately provide a high-concentration region for signal extraction to be adjacent to the charge collection regions 9b and 9c, and dispose other transfer electrodes on regions between the high-concentration region and each of the charge collection regions 9b and 9c, and provide a signal extraction electrode on the high-concentration region to extract a signal.

The light source unit 30 is a light irradiation unit configured to irradiate an object B with light L1, and includes a light source 31, a light source drive circuit 32, and a control circuit 33. The light source 31 includes a semiconductor light emitting element such as a laser element or a light emitting diode. The light source drive circuit 32 drives the light source 31 at a high frequency. The control circuit 33 outputs a driving clock of the light source drive circuit 32. In addition, the object B is periodically and repeatedly irradiated with pulsed light, which has been subjected to intensity modulation of a square wave, from the light source 31.

The irradiation light L1 from the light source 31 is reflected by a surface of the object B and is incident on each of the pixels P (m, n) in the imaging region 5 of the distance sensor 1A from a back surface 3b side of the semiconductor substrate 3 as reflected light L2. Incidentally, a plurality of imaging lenses corresponding to the pixels P (m, n), respectively, may be disposed to oppose the back surface 3b of the semiconductor substrate 3.

As illustrated in FIG. 4, the light receiving unit 9 further has two charge collection regions 9d (fifth charge collection regions). The charge collection regions 9d are formed in the surface region 3c of the semiconductor substrate 3, and are disposed so as to be adjacent to the photosensitive region 9a in the state of sandwiching the photosensitive region 9a. Then, the charge discharging electrode 17 is formed on the charge collection region 9d. The charge discharging electrode 17 is in contact with the charge collection region 9d through the opening formed in the insulating layer 41. The transfer electrode 13 is disposed on a region between the photosensitive region 9a and the charge collection region 9d. When a positive potential (on-potential) is applied to the transfer electrode 13, charge move from the photosensitive region 9a to the charge collection region 9d, and the charges are stored in a potential well of the charge collection region 9d. Incidentally, a specific configuration of the charge collection region 9d is the same as those of the charge collection regions 9b and 9c.

Figure 5A:
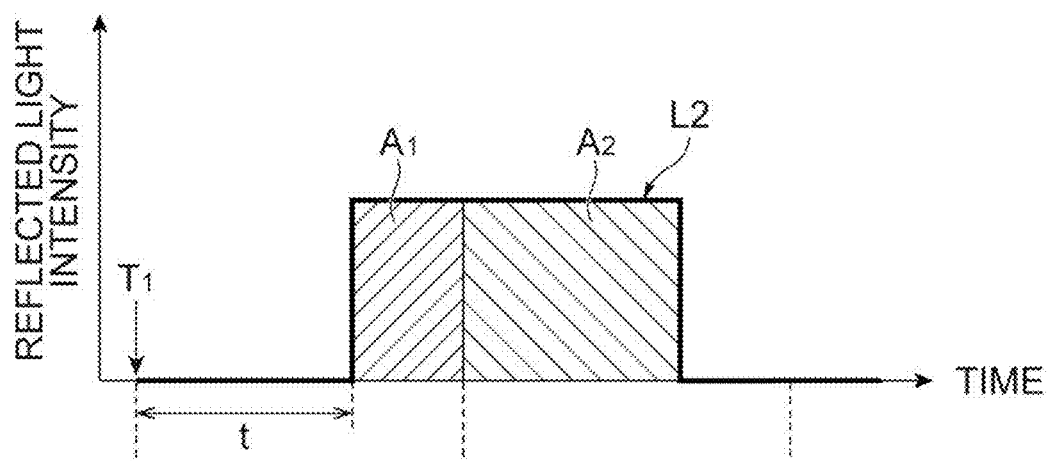
FIG. 5A is a graph illustrating an example of a temporal change of an intensity of reflected light incident on a certain pixel.
Figure 5B:
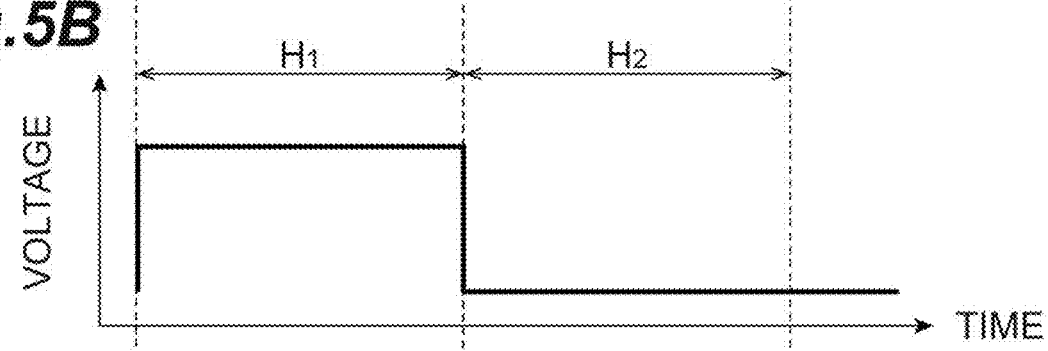
FIGS. 5B and 5C are graphs illustrating a temporal change of a voltage applied to each of two transfer electrodes.
Figure 5C:
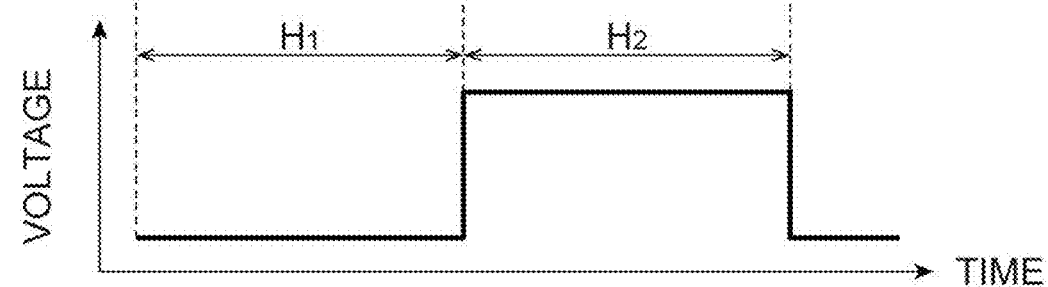

FIG. 5A is a graph illustrating an example of a temporal change of the intensity of reflected light incident on a certain pixel P (m, n). FIG. 5B is a graph illustrating a temporal change of the voltage applied to the transfer electrode 11. FIG. 5C is a graph illustrating a temporal change of the voltage applied to the transfer electrode 12. As illustrated in FIG. 5A, the reflected light L2 is incident on the pixel P (m, n) delayed from a light irradiation timing $T_1$ by a time t corresponding to a distance to the object B.

As illustrated in FIG. 5B, the transfer electrode 11 is set to the on-potential in a first period $H_1$ after light irradiation and set to the off-potential in a second period $H_2$ subsequent to the first period. In addition, the transfer electrode 12 is set to the off-potential in the first period $H_1$ and set to the on-potential in the second period $H_2$ as illustrated in FIG. 5C. Then, it is assumed that a part of the reflected light L2 (a region $A_1$ of the graph in the drawing) is incident on the pixel P (m, n) within the first period $H_1$. At this time, since the transfer electrode 12 is set to the off-potential while the transfer electrode 11 is set to the on-potential, the charges generated in the photosensitive region 9a move to the charge collection region 9b and are stored therein. The remaining part of the reflected light L2 (a region $A_2$ of the graph in the drawing) is incident on the pixel P (m, n) within the second period $H_2$. At this time, since the transfer electrode 11 is set to the off-potential while the transfer electrode 12 is set to the on-potential, the charges generated in the photosensitive region 9a move to the charge collection region 9c and are stored therein. Therefore, it is possible to know the delay time t, that is, the distance to the object B by obtaining a ratio between a charge amount stored in the charge collection region 9b (a charge amount of the storage node electrically coupled to the charge collection region 9b) and a charge amount stored in the charge collection region 9c (a charge amount of the storage node electrically coupled to the charge collection region 9c).

Here, the processing circuit 8 of the present embodiment may be configured to output a difference between these charge amounts by causing the charges stored in the charge collection region 9b and the charges stored in the charge collection region 9c to offset each other. Even in such a case, it is possible to know the ratio between the charge amount stored in the charge collection region 9b and the charge amount stored in the charge collection region 9c as long as it is possible to know the sum of the charge amounts stored in the charge collection regions 9b and 9c (the sum of the charge amounts of the storage nodes coupled, respectively, to the charge collection regions 9b and 9c). Hereinafter, a driving system of the imaging region 5 (a driving system of the distance sensor according to the present embodiment) configured to know the sum of the charge amounts stored in the charge collection regions 9b and 9c will be described.

Figure 6:
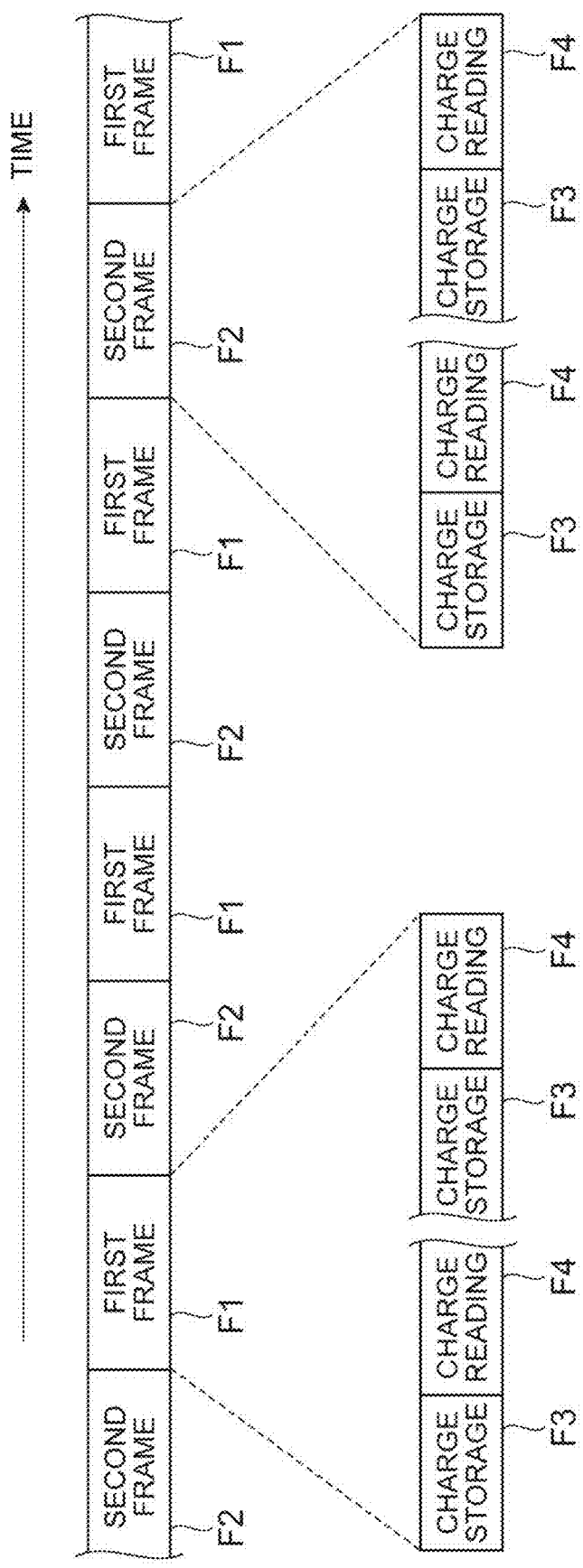
FIG. 6 is a view illustrating a driving system of an imaging region using a sensor drive circuit.

The sensor drive circuit 7 according to the present embodiment drives the transfer electrodes 11 and 12 by sequentially executing a plurality of time-divided frames (each of which represents a drive pattern of a transfer electrode). FIG. 6 is a view illustrating the driving system of the imaging region 5 using the sensor drive circuit 7. As illustrated in FIG. 6, in the driving system of the present embodiment, processing in each of first and second frames F1 and F2 is performed while alternately repeating the frames F1 and F2. FIG. 6 also illustrates processing contents within the respective frames F1 and F2. Within each of the frames F1 and F2, a storage frame F3 to perform charge storage into the charge collection regions 9b and 9c (charge storage into storage nodes coupled, respectively, to the charge collection regions 9b and 9c) and a reading frame F4 to perform charge reading from the charge collection regions 9b and 9c are alternately repeated.

FIGS. 7A and 7B are timing charts illustrating operations of the transfer electrodes 11 to 13 in the storage frame F3. FIG. 7A illustrates the timing chart in the first frame F1, and FIG. 7B illustrates the timing chart in the second frame F2. FIGS. 7A and 7B illustrate a driving clock CL of the light source drive circuit 32 output from the control circuit 33 (that is, a temporal change of an intensity of pulsed light output from the light source 31), a drive voltage $Vtx_1$ applied to the transfer electrode 11, a drive voltage $Vtx_2$ applied to the transfer electrode 12, and a drive voltage Vtxr applied to the transfer electrode 13.

In the storage frame F3, the drive voltages $Vtx_1$ and $Vtx_2$ are repeatedly switched between the on-potential and the off-potential twice at a certain cycle T each time the driving clock CL rises once. The cycle T is set to twice an on-time $t_L$ of the driving clock CL (for example, $T=2t_L$). In addition, an on-time (a period during which a drive voltage is set to the on-potential) of the drive voltages $Vtx_1$ and $Vtx_2$ in each cycle is equal to the on-time $t_L$ of the driving clock CL.

Specifically, equally-spaced times $t_0, t_1, \ldots,$ and $t_9$ are defined in the storage frame F3 of each of the first frame F1 and the second frame F2 as illustrated in FIGS. 7A and 7B. An interval among these times is half of one-time irradiation time $t_L$ of the irradiation light L1. At this time, the light source unit 30 emits the irradiation light L1 for the times $t_1$ to $t_3$. Then, the sensor drive circuit 7 sets the drive voltage $Vtx_1$ to the on-potential between the times $t_0$ and $t_2$ and between the times $t_4$ and $t_6$ and the drive voltage $Vtx_2$ to the on-potential between the times $t_2$ and $t_4$ and between the times $t_6$ and $t_8$ in the first frame F as illustrated in FIG. 7A. In addition, the sensor drive circuit 7 sets the drive voltage $Vtx_1$ to the on-potential between the times $t_1$ and $t_3$ and between the times $t_5$ and $t_7$ and the drive voltage $Vtx_2$ to the on-potential between the times $t_3$ and $t_5$ and between the times $t_7$ and $t_9$ in the second frame F2 as illustrated in FIG. 7B.

Incidentally, the drive voltage Vtxr applied to the transfer electrode 13 is set to the on-potential except for a period during which the other drive voltages $Vtx_1$ and $Vtx_2$ are initially set to the on-potential and then finally set to the off-potential. That is, the drive voltage Vtxr is set to the off-potential between the times $t_0$ and $t_8$ in the first frame F1, is set to the off-potential between the times $t_1$ and $t_9$ in the second frame F2, and is set to the on-potential in the other periods.

In other words, the above operation is performed as follows. In the first frame F1, the drive voltage $Vtx_1$ rises at a timing earlier by $(t_L/2)$ than the rise timing of the driving clock CL. Hereinafter, a phase of the drive voltage $Vtx_1$ in the first frame F1 is set to 0°. The drive voltage $Vtx_2$ rises at a timing later by $t_L$ than the rise timing of the drive voltage $Vtx_1$. In other words, a phase of the drive voltage $Vtx_2$ in the first frame F1 is 180°. In the second frame F2, the drive voltage $Vtx_1$ rises at the same timing as the rise timing of the driving clock CL. In other words, a phase of the drive voltage $Vtx_1$ in the second frame F2 is 900. In addition, the drive voltage $Vtx_2$ rises at a timing later by $t_L$ than the rise timing of the drive voltage $Vtx_1$. In other words, a phase of the drive voltage $Vtx_2$ in the second frame F2 is 270°.

Here, FIG. 8 is a view illustrating the timing charts of the first frame F1 and the second frame F2 illustrated in FIGS. 7A and 7B for the one-time driving clock CL in an overlapping manner in order to facilitate understanding. A drive voltage $Vtx_1(1)$ and a drive voltage $Vtx_2(1)$ respectively represent the drive voltages $Vtx_1$ and $Vtx_2$ in the first frame F1, and a drive voltage $Vtx_1(2)$ and a drive voltage $Vtx_2(2)$ respectively represent the drive voltages $Vtx_1$ and $Vtx_2$ in the second frame F2.

Figure 9:
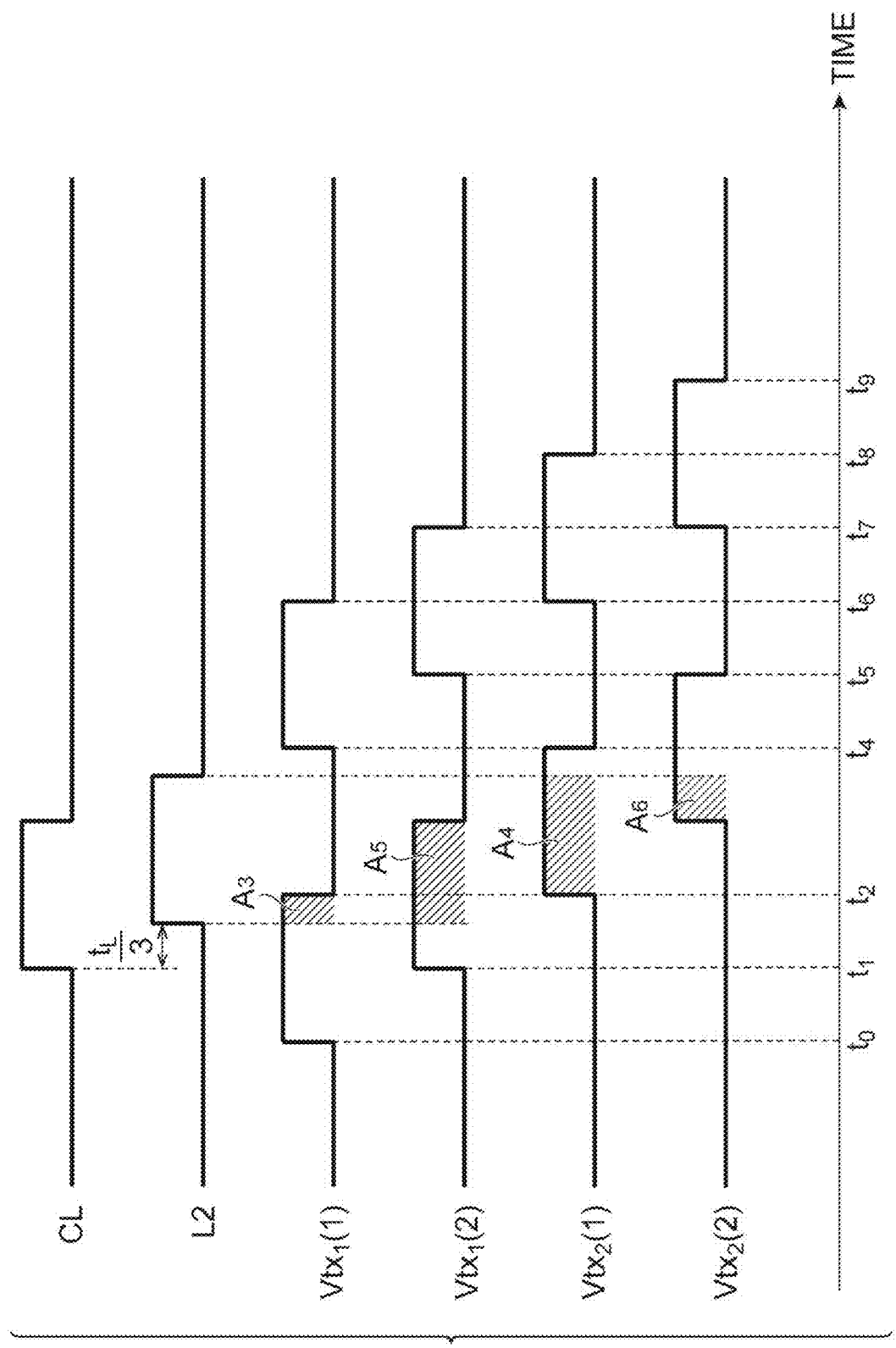
FIG. 9 is a view further illustrating a chart of reception light pulse waveforms of reflected light in the timing chart illustrated in FIG. 8.
Figure 10:
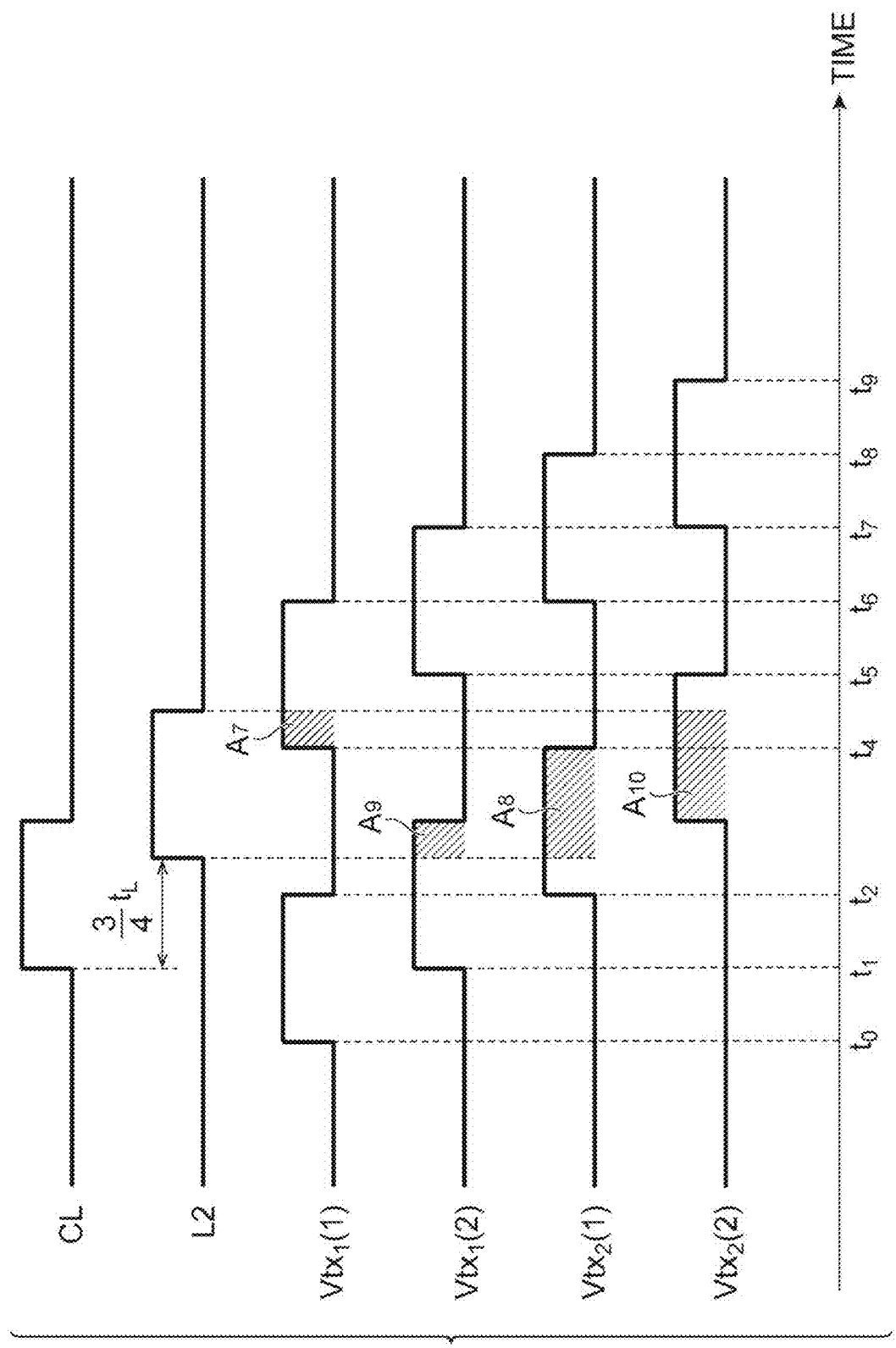
FIG. 10 is a view further illustrating a chart of reception light pulse waveforms of reflected light in the timing chart illustrated in FIG. 8.

FIGS. 9 and 10 further illustrate a chart of a light reception pulse waveform of the reflected light L2 in the timing chart illustrated in FIG. 8. As illustrated in FIG. 9, it is assumed that the reflected light L2 is incident on the pixel P (m, n) after a time $(t_L/3)$ has passed since the object B is irradiated with light L. At this time, in the first frame F1, charges corresponding to the area of a region $A_3$ in FIG. 9 are stored in the charge collection region 9b, and a charge corresponding to the area of a region $A_4$ is stored in the charge collection region 9c. Assuming that the total charge amount generated by the reflected light L2 is Q, a charge amount stored in the charge collection region 9b is Q/6, and a charge amount stored in the charge collection region 9c is (5×Q/6). In addition, in the second frame F2, charges corresponding to the area of a region $A_5$ in the drawing are stored in the charge collection region 9b, and charges corresponding to the area of a region $A_6$ are stored in the charge collection region 9c. At this time, a charge amount stored in the charge collection region 9b is (2×Q/3), and a charge amount stored in the charge collection region 9c is Q/3. Then, the charge amount Q/6 of the charge collection region 9b in the first frame F1 is subtracted from the charge amount (5×Q/6) of the charge collection region 9c in the first frame F1, thereby obtaining a value of (2×Q/3). Similarly, the charge amount (2×Q/3) of the charge collection region 9b in the second frame F2 is subtracted from the charge amount Q/3 of the charge collection region 9c in the second frame F2, thereby obtaining a value of −Q/3. Then, when absolute values of these values are added, the total charge amount Q generated by the reflected light L2 is obtained.

Next, it is assumed that the reflected light L2 is incident on the pixel P (m, n) after a time $(3×t_L/4)$ has passed since the object is irradiated with the light L1 as illustrated in FIG. 10. At this time, in the first frame F1, charges corresponding to the area of a region $A_7$ in the drawing are stored in the charge collection region 9b, and charges corresponding to the area of a region $A_8$ are stored in the charge collection region 9c. At this time, a charge amount stored in the charge collection region 9b is Q/4, and a charge amount stored in the charge collection region 9c is (3×Q/4). In addition, in the second frame F2, charges corresponding to the area of a region $A_9$ in the drawing are stored in the charge collection region 9b, and charges corresponding to the area of a region $A_{10}$ are stored in the charge collection region 9c. At this time, a charge amount stored in the charge collection region 9b is Q/4, and a charge amount stored in the charge collection region 9c is (3×Q/4). Then, the charge amount Q/4 of the charge collection region 9b in the first frame F1 is subtracted from the charge amount (3×Q/4) of the charge collection region 9c in the first frame F1, thereby obtaining a value of Q/2. Similarly, the charge amount Q/4 of the charge collection region 9b in the second frame F2 is subtracted from the charge amount (3×Q/4) of the charge collection region 9c in the second frame F2, thereby obtaining a value of Q/2. Then, when absolute values of these values are added, the total charge amount Q generated by the reflected light L2 is obtained.

As is apparent from the above example, it is possible to obtain the total charge amount Q generated by the reflected light L2 by adding the absolute value of the value obtained by subtracting the amount of charge collected at the phase 0°, that is, the times $t_0$ to $t_2$ and $t_4$ to $t_6$ from the amount of charge collected at phase 180°, that is, times $t_2$ and $t_4$ and $t_6$ and $t_8$ and the absolute value of the value obtained by subtracting the amount of charge collected at the phase 90°, that is, the times $t_1$ and $t_3$ and $t_5$ and $t_7$ from the amount of charge collected at the phase 270°, that is, the times $t_3$ and $t_5$ and $t_7$ and $t_9$. Therefore, it is possible to know the delay time t, that is, the distance to the object B by obtaining the ratio of the charge amounts stored in the charge collection regions 9b and 9c (the ratio of the charge amounts stored in the storage nodes coupled, respectively, to the charge collection regions 9b and 9c) based on the total charge amount Q obtained in this manner and the difference between the charge amounts stored in the storage nodes coupled, respectively, to the charge collection regions 9b and 9c obtained from the processing circuit 8.

The above-described distance calculation method will be described in more general terms. FIG. 11A is a graph illustrating a relationship between a value obtained by subtracting the charge amount of the storage node coupled to the charge collection region 9b from the charge amount of the storage node coupled to the charge collection region 9c (that is, an output value from each of the pixels P (m, n)) and the time t from the irradiation of the light L1 to the incidence of the reflected light L2 (that is, the distance to the object B). In FIG. 11A, a graph G11 indicates the output value in the first frame F1 and a graph G12 indicates the output value in the second frame F2. Incidentally, the output value is normalized so as to have a maximum value of 1 and a minimum value of −1 for convenience.

As indicated by the graph G1 of FIG. 11A, in the first frame F1, the output value increases from 0 to 1 in a section $D_1$ of $0<t<t_L/2$, the output value decreases from 1 to 0 in a section $D_2$ of $t/2<t<t_L$, the output value further decreases from 0 to −1 in a section $D_3$ of $t_L<t<(3×t_L/2)$, and the output value increases from −1 to 0 in a section $D_4$ of $(3×t_L/2)<t<2t_L$. In addition, as indicated by the graph G12, in the second frame F2, the output value increases from −1 to 0 in the section $D_1$, the output value further increases from 0 to 1 in the section $D_2$, the output value decreases from 1 to 0 in the section $D_3$, and the output value further decreases from 0 to −1 in the section $D_4$.

That is, as illustrated in a chart of FIG. 11B, signs of the output values in the first frame F1 and the second frame F2 become (−) and (+), respectively, in the section $D_1$, become (+) and (+), respectively, in the section $D_2$, become (+) and (−), respectively, in the section $D_3$, and become (−) and (−), respectively, in the section $D_4$. Therefore, it is possible to determine the section among the sections $D_1$ to $D_4$ where the time t from the irradiation of the light L1 to the incidence of the reflected light L2 is present based on a combination of the signs of the output values in the first frame F1 and the second frame F2.

Next, absolute values of the respective output values of the first frame F and the second frame F2 are obtained as illustrated in FIG. 11C. Specifically, the sign of the output value (graph G12) of the second frame F2 is inverted in the section $D_1$, the sign of the output value (graph G11) of the first frame F1 is inverted in the section $D_2$, the signs of the output values of the first frame F1 and the second frame F2 are inverted (graphs G13 and G14 in the drawing) in the section $D_3$. Thereafter, a graph G21 having a constant value regardless of the time t is obtained by adding the absolute values of the respective output values of the first frame F and the second frame F2. This graph G21 represents the total charge amount (the above-described charge amount Q) generated by the reflected light L2.

Figure 12A:
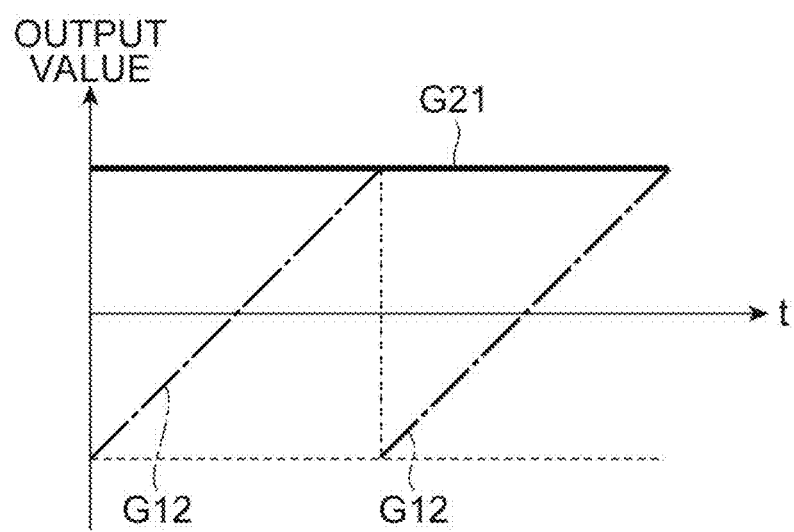
FIGS. 12A to 12C are graphs illustrating a method for calculating a distance from output values in the first frame and the second frame.
Figure 12B:
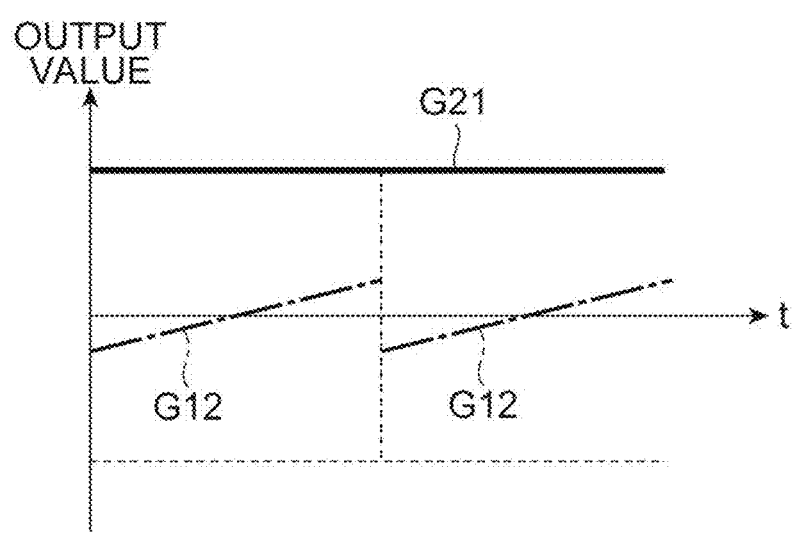
Figure 12C:
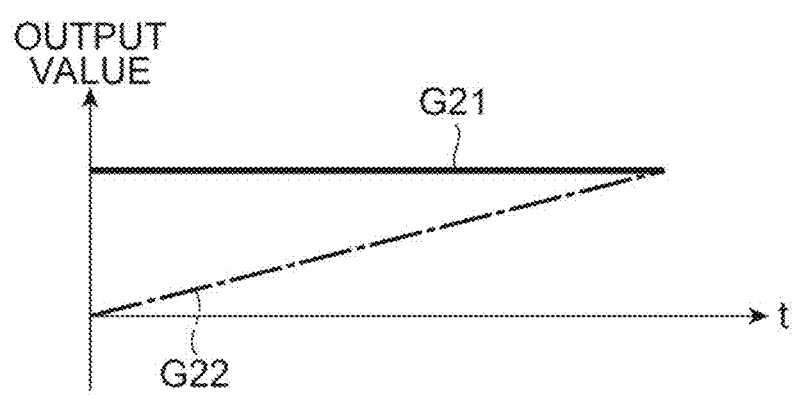

Subsequently, the sign of the output value of the second frame F2 in the sections $D_3$ and $D_4$ (graph G12 in FIG. 11A) is inverted as illustrated in FIG. 12A. As a result, both the output value of the second frame F2 in the sections $D_1$ and $D_2$ and the output value of the second frame F2 in the sections $D_3$ and $D_4$ have a positive slope with respect to the time t. Then, both of the output value of the second frame F2 in the sections $D_1$ and $D_2$ and the output value of the second frame F2 in the sections $D_3$ and $D_4$ are multiplied by ¼ as illustrated in FIG. 12B. Finally, an appropriate offset value is added to each of the output value of the second frame F2 in the sections $D_1$ and $D_2$ and the output value of the second frame F2 in the sections $D_3$ and $D_4$, thereby obtaining a linear graph G22 in which the output value increases from 0 to 1 in a range of $0 \leq t \leq 2t_L$ as illustrated in FIG. 12C. As a result, it is possible to know the time t, that is, the distance to the object B, based on the graph G21 and the graph G22. Incidentally, the order of the respective operations illustrated in FIGS. 12A to 12C is not limited to the above-described one, and may be performed in a different order. Alternatively, the respective operations illustrated in FIGS. 12A to 12C may be performed at the same time. In addition, the output value of the second frame F2 is used in the description of FIGS. 12A to 12C, but the graph G22 of FIG. 12C may be calculated using the output value of the first frame F1.

According to the distance sensor 1A and the driving method according to the present embodiment, it is possible to obtain the time t, that is, the distance to the object B based on the difference between the charge amounts stored in the storage nodes coupled, respectively, to the charge collection regions 9b and 9c as described above. Therefore, it is possible to adopt the use method of injecting the equal amount of current to each storage node, and as a result, it is possible to avoid saturation of each storage node. Hereinafter, an example of a circuit configuration for injection of the equal amount of current to each storage node will be described in detail.

Figure 13:
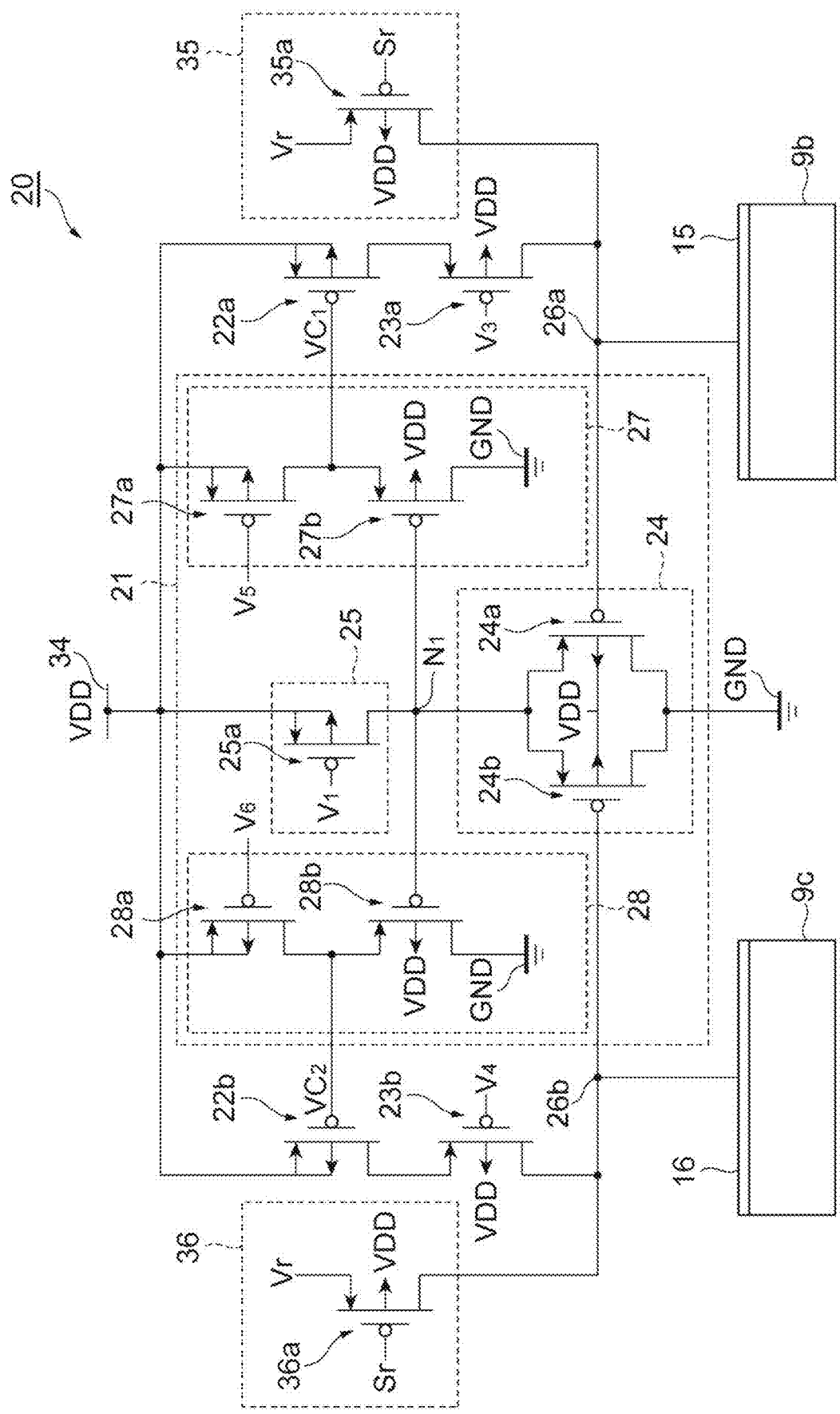
FIG. 13 is a circuit diagram illustrating a detailed configuration of a current injection circuit.

FIG. 13 is a circuit diagram illustrating a detailed configuration of the current injection circuit 20 illustrated in FIG. 1. As illustrated in FIG. 13, the current injection circuit 20 of the present embodiment includes a voltage generation circuit 21 and transistors 22a, 22b, 23a, and 23b. The transistors 22a, 22b, 23a and 23b are field-effect transistors, for example, p-channel MOSFETs.

The voltage generation circuit 21 is connected between a power supply potential line 34 and a reference potential line GND having a lower potential than the power supply potential line 34. The voltage generation circuit 21 generates control voltages $VC_1$ and $VC_2$ corresponding to a larger one between the charge amounts stored in the charge collection regions 9b and 9c. Specifically, the voltage generation circuit 21 includes a transistor pair 24 and a current source 25 connected in series between the power supply potential line 34 and the reference potential line GND. Furthermore, the voltage generation circuit 21 has buffer circuits 27 and 28.

The transistor pair 24 includes transistors 24a and 24b. The transistors 24a and 24b are field-effect transistors, for example, p-channel MOSFETs. One current terminals (first current terminals) of the transistors 24a and 24b are short-circuited from each other and are electrically connected to the power supply potential line 34 via the current source 25. The other current terminals (second current terminals) of the transistors 24a and 24b are short-circuited from each other and are electrically connected to the reference potential line GND. A control terminal of the transistor 24a is electrically connected to the signal extraction electrode 15 on the charge collection region 9b via a storage node 26a. A control terminal of the transistor 24b is electrically connected to the signal extraction electrode 16 on the charge collection region 9c via a storage node 26b. The storage node 26a stores the charge collected in the charge collection region 9b, and the storage node 26b stores the charge collected in the charge collection region 9c.

The current source 25 includes a transistor 25a. The transistor 25a is a field-effect transistor, for example, a p-channel MOSFET. One current terminal (first current terminal) of the transistor 25a is electrically connected to the power supply potential line 34. The other current terminal (second current terminal) of the transistor 25a is electrically connected to the first current terminal of each of the transistors 24a and 24b. A predetermined bias voltage $V_1$ is applied to a control terminal of the transistor 25a. Incidentally, the current source may further include another transistor connected in parallel with the transistor 25a.

The transistor 22a supplies a current for eliminating a disturbance light component to avoid saturation of the storage node 26a to the storage node 26a. One current terminal (first current terminal) of the transistor 22a is connected to the power supply potential line 34, and the other current terminal (second current terminal) is connected to the storage node 26a via the transistor 23a. A control terminal of the transistor 22a is electrically connected to a node $N_1$ between the transistor pair 24 and the current source 25 via the buffer circuit 27.

The transistor 22b supplies a current for eliminating the disturbance light component to the storage node 26b. One current terminal (first current terminal) of the transistor 22b is connected to the power supply potential line 34, and the other current terminal (second current terminal) is connected to the storage node 26b via the transistor 23b. A control terminal of the transistor 22b is connected to the node $N_1$ via the buffer circuit 28.

The transistor 23a is cascode-connected to the transistor 22a, and prevents an operation of the transistor 22a from being affected by a fluctuation of a potential of the storage node 26a. Specifically, one current terminal (first current terminal) of the transistor 23a is connected to the second current terminal of the transistor 22a, and the other current terminal (second current terminal) of the transistor 23a is connected to the storage node 26a. A predetermined bias voltage $V_3$ is applied to a control terminal of the transistor 23a.

The transistor 23b is cascode-connected to the transistor 22b and prevents an operation of the transistor 22b from being affected by a fluctuation of a potential of the storage node 26b. Specifically, one current terminal (first current terminal) of the transistor 23b is connected to the second current terminal of the transistor 22b, and the other current terminal (second current terminal) of the transistor 23b is connected to the storage node 26b. A predetermined bias voltage $V_4$ is applied to a control terminal of the transistor 23b. Incidentally, the bias voltage $V_3$ and the bias voltage $V_4$ are equal to each other in one example.

The buffer circuit 27 shifts a potential of the node $N_1$ to generate a control voltage $VC_1$ and provides the generated control voltage to the control terminal of the transistor 22a. The buffer circuit 27 is configured to include, for example, a source follower circuit. Specifically, the buffer circuit 27 has transistors 27a and 27b connected in series to each other. One current terminal (first current terminal) of the transistor 27a is connected to the power supply potential line 34, and the other current terminal (second current terminal) is connected to one current terminal (first current terminal) of the transistor 27b. The other current terminal (second current terminal) of the transistor 27b is connected to the reference potential line GND. A predetermined bias voltage $V_5$ is applied to a control terminal of the transistor 27a. The potential of the node $N_1$ is input to a control terminal of the transistor 27b. The buffer circuit 27 outputs the control voltage $VC_1$ having a magnitude corresponding to the potential of the node $N_1$ from the node between the transistors 27a and 27b.

The buffer circuit 28 shifts the potential of the node $N_1$ to generate a control voltage $VC_2$ and provides the generated control voltage to the control terminal of the transistor 22b. The buffer circuit 28 is configured to include, for example, a source follower circuit. Specifically, the buffer circuit 28 has transistors 28a and 28b connected in series to each other. One current terminal (first current terminal) of the transistor 28a is connected to the power supply potential line 34, and the other current terminal (second current terminal) is connected to one current terminal (first current terminal) of the transistor 28b. The other current terminal (second current terminal) of the transistor 28b is connected to the reference potential line GND. A predetermined bias voltage $V_6$ is applied to a control terminal of the transistor 28a. The potential of the node $N_1$ is input to a control terminal of the transistor 28b. The buffer circuit 28 outputs the control voltage $VC_2$ having a magnitude corresponding to the potential of the node $N_1$ from the node between the transistors 28a and 28b. Magnitudes of the bias voltages $V_5$ and $V_6$ are set such that the amount of current supplied from the transistor 22a to the storage node 26a and the amount of current supplied from the transistor 22b to the storage node 26b are equal to each other and, for example, $V_5=V_6$ may be set.

Incidentally, the buffer circuits 27 and 28 may be omitted. In such a case, the control terminals of the transistors 22a and 22b are directly connected to the node $N_1$, and the potential of the node $N_1$ is provided to these control terminals as the control voltages $VC_1$ and $VC_2$.

The current injection circuit 20 further includes reset circuits 35 and 36. The reset circuit 35 has a transistor 35a, and the reset circuit 36 has a transistor 36a. A reset potential Vr is input to one current terminals (first current terminals) of the transistors 35a and 36a. The other current terminal (second current terminal) of the transistor 35a is connected to the storage node 26a, and the other current terminal (second current terminal) of the transistor 36a is connected to the storage node 26b. A reset signal Sr is input to control terminals of the transistors 35a and 36a, and the charges of the storage nodes 26a and 26b are discharged as the transistors 35a and 36a are turned into on-states.

An operation of the current injection circuit 20 having the above configuration will be described. When the reflected light L2 is incident on the pixel P (m, n), the charges flow into the charge collection regions 9b and 9c at the ratio corresponding to the distance to the object B (see FIGS. 5A to 5C). In addition, the charges corresponding to the magnitude of the disturbance light incident on the pixel P (m, n) also flow into the charge collection regions 9b and 9c. However, when the on-time of the drive voltage applied to the transfer electrode 11 and the on-time of the drive voltage applied to the transfer electrode 12 are equal to each other, the charge amounts flowing into the charge collection regions 9b and 9c due to the disturbance light are equal to each other.

As a result, potentials of the storage nodes 26a and 26b have magnitudes corresponding to the charge amounts flowing into the charge collection regions 9b and 9c, respectively. Then, when the charges continue to flow into the charge collection regions 9b and 9c in the storage frame F3 (see FIG. 6) and one of the potentials of the storage nodes 26a and 26b exceeds a turn-on voltage, one of the transistors 24a and 24b starts to flow a current according to the potential of the one storage node. Therefore, the potential of the node $N_1$ has a magnitude corresponding to a larger one between the charge amounts stored in the charge collection regions 9b and 9c (storage nodes 26a and 26b). The control voltages $VC_1$ and $VC_2$ having magnitudes corresponding to the potential of the node $N_1$ are output, respectively, to the control terminals of the transistors 22a and 22b.

The transistors 22a and 22b receive the above control voltages $VC_1$ and $VC_2$ at their control terminals and cause current corresponding to each magnitude of the control voltages $VC_1$ and $VC_2$ to flow. Here, since the predetermined bias voltages $V_3$ and $V_4$ are constantly applied to the control terminals of the transistors 23a and 23b, respectively, the current from each of the transistors 23a and 23b is injected into each of the storage nodes 26a and 26b. As a result, the same amount of charge is offset at the storage nodes 26a and 26b, and the saturation of the storage nodes 26a and 26b (charge collection regions 9b and 9c) caused by the disturbance light is avoided.

Effects that can be obtained by the distance sensor 1A and the driving method of the distance sensor 1A according to the present embodiment as described above will be described. In the present embodiment, the distance to the object B can be obtained based on the difference between the charge amounts stored in the storage nodes coupled, respectively, to the charge collection regions 9b and 9c as described above. Therefore, it is possible to adopt the use method of injecting the equal amount of current to each storage node using the current injection circuit 20, and as a result, it is possible to avoid saturation of each storage node.

In addition, in the present embodiment, since pulsed light is applied as the irradiation light L1, it is easy to provide a period for discharging the charges as compared with the method described in Non Patent Document 1 in which the triangular wave light is used. Thus, it is possible to reduce shot noise in the present embodiment. Furthermore, the light emission state of the light source is intermittent in the present embodiment as compared with the case of outputting the triangular wave light, and thus, it is possible to increase the intensity of the irradiation light. That is, it is possible to increase the intensity of the irradiation light with respect to the intensity of the disturbance light (that is, an S/N ratio). In addition, there is an advantage that the selectivity of the light source such as a duty ratio and a light quantity is high (selection is easy) in the case of outputting intermittent light such as the pulsed shape, as compared with the case of continuous light such as the triangular wave light.

In addition, in a distance sensor described in Patent Document 1, it is only possible to measure up to a distance corresponding to a delay time equal to the irradiation time of the irradiation light L1. On the other hand, according to the present embodiment, it is possible to measure up to a distance corresponding to a delay time twice the irradiation time of the irradiation light L (the time $t_L$ in FIGS. 7A and 7B).

In addition, the sensor drive circuit 7 may drive the transfer electrode 13 in each of the frames F1 and F2 as described above as in the present embodiment. As a result, it is possible to discharge the charges generated by the disturbance light using the transfer electrode 13 except for a period during which the transfer electrodes 11 and 12 are driven. Therefore, it is possible to further suppress saturation caused by the disturbance light and reduce shot noise caused by the disturbance light, and thus, it is possible to improve a resistance against the disturbance light and distance measurement accuracy.

In addition, in the current injection circuit 20 of the present embodiment, cascode devices such as the transistors 23a and 23b are connected between each of the transistors 22a and 22b and each of the storage nodes 26a and 26b. As a result, the respective potentials of the transistors 22a and 22b and the storage nodes 26a and 26b are separated. Thus, even if there is a potential difference between the storage node 26a and the storage node 26b, the influence on drain-source voltages of the transistors 22a and 22b is suppressed, and it is possible to make the drain-source voltages of these transistors 22a and 22b equal to each other. Furthermore, the difference in the amounts of current injected from each of the transistors 22a and 22b to each of the storage nodes 26a and 26b (charge collection regions 9b and 9c) is reduced, and it is possible to accurately control these injection current amounts to a substantially uniform magnitude. Therefore, it is possible to reduce an error at the time of outputting the difference between the charge amounts stored in the charge collection regions 9b and 9c in the processing circuit 8 and to improve the accuracy of the measured distance.

(First Modification)

FIGS. 14A and 14B are views illustrating timing charts of a driving method according to a first modification of the above embodiment. The sensor drive circuit 7 of the above embodiment may drive the transfer electrodes 11 and 12 based on the timing charts illustrated in FIGS. 14A and 14B instead of the timing charts illustrated in FIGS. 7A and 7B.

A difference between the timing chart of the first modification and the timing chart of the above embodiment is a length of an on-time of the drive voltages $Vtx_1$ and $Vtx_2$. In the above embodiment, the on-time of the drive voltages $Vtx_1$ and $Vtx_2$ is equal to the on-time of the driving clock CL (that is, the irradiation time of the irradiation light L1) $t_L$; however, the on-time of the drive voltages $Vtx_1$ and $Vtx_2$ is half the time $t_L$ ($t_1/2$) in the first modification.

Specifically, equally-spaced times $t_0, t_1, \ldots,$ and $t_8$ are defined in the storage frame F3 of each of the first frame F1 and the second frame F2 as illustrated in FIGS. 14A and 14B. An interval among these times is half of one-time irradiation time $t_L$ of the irradiation light L1. At this time, the light source unit 30 emits the irradiation light L1 for the times $t_1$ to $t_3$. Then, the sensor drive circuit 7 sets the drive voltage $Vtx_1$ to the on-potential between the times $t_0$ and $t_1$ and between the times $t_4$ and $t_5$ and the drive voltage $Vtx_2$ to the on-potential between the times $t_2$ and $t_3$ and between the times $t_0$ and $t_7$ in the first frame F1 as illustrated in FIG. 14A. In addition, the sensor drive circuit 7 sets the drive voltage $Vtx_1$ to the on-potential between the times $t_1$ and $t_2$ and between the times $t_5$ and $t_6$ and the drive voltage $Vtx_2$ to the on-potential between the times $t_3$ and $t_4$ and between the times $t_7$ and t in the second frame F2 as illustrated in FIG. 14B.

Incidentally, the drive voltage Vtxr applied to the transfer electrode 13 is set to the on-potential except for a period during which the other drive voltages $Vtx_1$ and $Vtx_2$ are initially set to the on-potential and then finally set to the off-potential. That is, the drive voltage Vtxr is set to the off-potential between the times $t_0$ and $t_7$ in the first frame F1, is set to the off-potential between the times $t_1$ and $t_8$ in the second frame F2, and is set to the on-potential in the other periods.

Figure 15A:
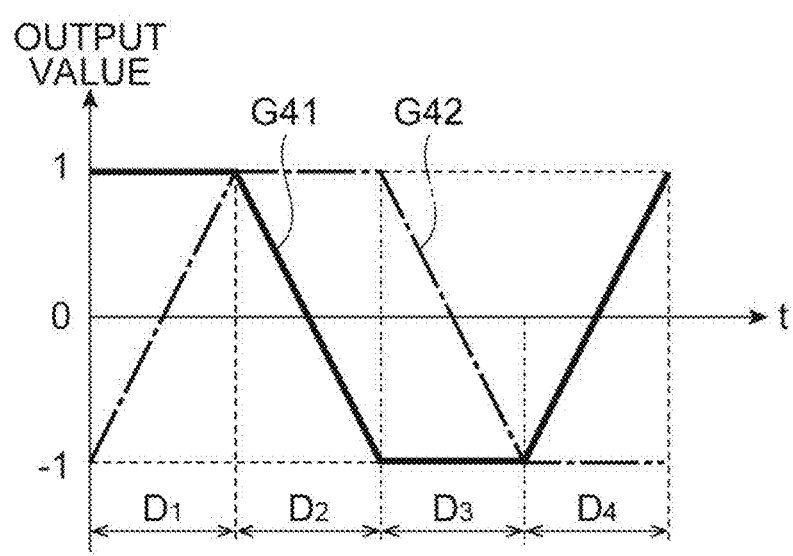
FIGS. 15A to 15C are views for describing a distance calculation method according to the first modification.
Figure 15B:
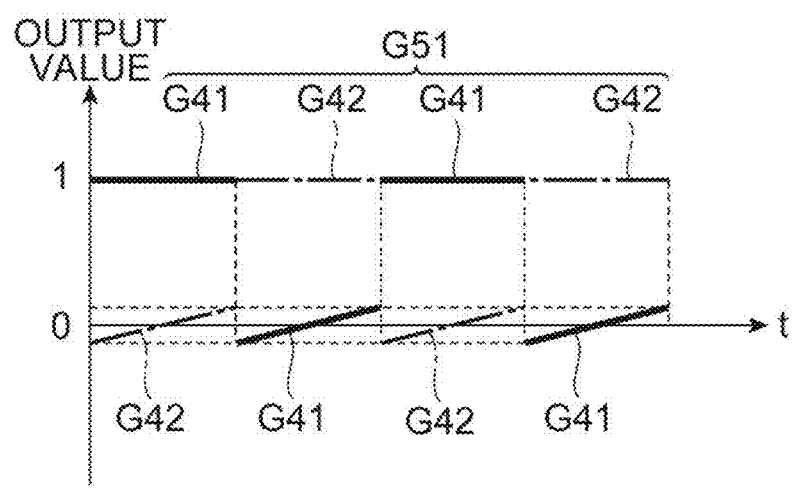
Figure 15C:
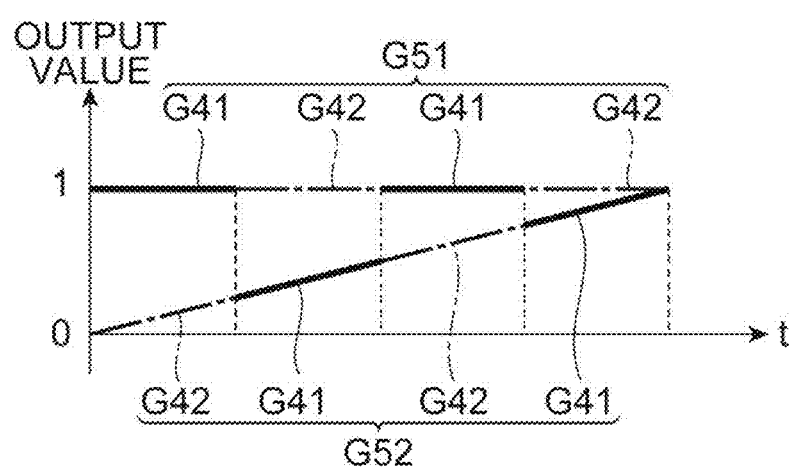

FIGS. 15A and 15C are views for describing a distance calculation method in the first modification. FIG. 15A is a graph illustrating a relationship between a value obtained by subtracting a charge amount of a storage node coupled to the charge collection region 9b from a charge amount of a storage node coupled to the charge collection region 9c (that is, an output value from each of the pixels P (m, n)) and the time t from irradiation of the light L1 to incidence of the reflected light L2 (that is, a distance to the object B). In FIG. 15A, a graph G41 indicates the output value in the first frame F1 and a graph G42 indicates the output value in the second frame F2. Incidentally, the output value is normalized so as to have a maximum value of 1 and a minimum value of -1 for convenience.

As indicated by the graph G41 of FIG. 15A, in the first frame F1, the output value is constant as 1 in a section $D_1$ of $0<t<t_L/2$, the output value decreases from 1 to -1 in a section $D_2$ of $t_L/2<t<t_L$, the output value is constant as -1 in a section $D_3$ of $t_L<t<(3\times t_L/2)$, and the output value increases from -1 to 1 in a section $D_4$ of $(3\times t_L/2)<t<2t_L$. In addition, as indicated by the graph G42, in the second frame F2, the output value increases from -1 to 1 in the section $D_1$, the output value is constant as 1 in the section $D_2$, the output value decreases from 1 to -1 in the section $D_3$, and the output value is constant as -1 in the section $D_4$.

Here, absolute values of the respective output values of the first frame F and the second frame F2 are obtained, and the output value of the larger one between the output values of the first frame F1 and the second frame F2 is selected. Then, a graph G51 having a constant value regardless of the time t is obtained as illustrated in FIG. 15B. This graph G51 represents ½ of the total charge amount generated by the reflected light L2.

Meanwhile, a sign of a smaller absolute value between the output values of the first frame F1 and the second frame F2 is inverted in a section where the output value (graph G41) of the first frame F1 is smaller than the output value (graph G42) of the second frame F2 among the respective sections $D_1$ to $D_4$. In the example of FIG. 15A, signs of the output value of the first frame F1 in the section $D_2$ and the output value of the second frame F2 in the section $D_3$ are inverted. As a result, both the output value of the second frame F2 in the sections $D_1$ and $D_3$ and the output value of the first frame F1 in the sections $D_2$ and $D_4$ have a positive slope with respect to the time t. Then, both of the output value of the second frame F2 in the sections $D_1$ and $D_3$ and the output value of the first frame F1 in the sections $D_2$ and $D_4$ are multiplied by ¼ as illustrated in FIG. 15B. Finally, an appropriate offset value is added to each of the output value of the second frame F2 in the sections $D_1$ and $D_3$ and the output value of the first frame F1 in the sections $D_2$ and $D_4$, thereby obtaining a linear graph G52 in which the output value increases from 0 to 1 in a range of $0 \leq t \leq 2t_L$ as illustrated in FIG. 15C. As a result, it is possible to know the time t, that is, the distance to the object B, based on the graph G51 and the graph G52. Incidentally, the order of the respective operations illustrated in FIGS. 15A to 15C is not limited to the above-described one, and may be performed in a different order. Alternatively, the respective operations illustrated in FIGS. 15A to 15C may be performed at the same time.

According to this first modification, the distance to the object B can be obtained based on the difference between the charge amounts stored in the storage nodes coupled, respectively, to the charge collection regions 9b and 9c similarly to the above embodiment. Therefore, it is possible to adopt the use method of injecting the equal amount of current to each storage node, and as a result, it is possible to avoid saturation of each storage node. In addition, it is also possible to suitably achieve the other effects of the above embodiment.

In addition, the sensor drive circuit 7 may drive the transfer electrode 13 in each of the frames F1 and F2 as described above in the first modification. As a result, it is possible to further suppress saturation caused by disturbance light and reduce shot noise caused by the disturbance light, and thus, it is possible to improve a resistance against the disturbance light and distance measurement accuracy.

(Second Modification)

Figure 16:
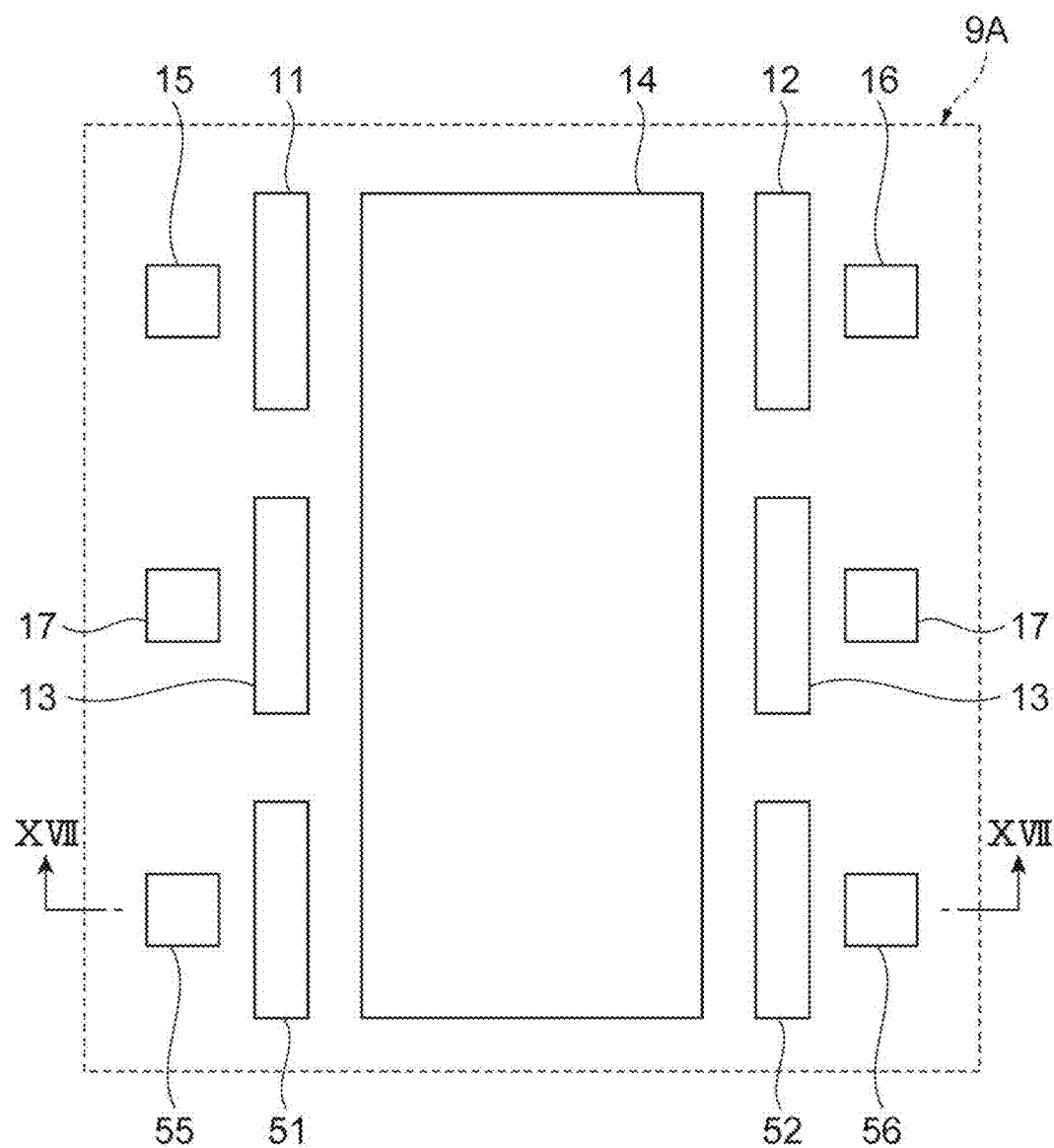
FIG. 16 is a plan view illustrating a light receiving unit according to a second modification.

FIG. 16 is a plan view illustrating a light receiving unit 9A according to a second modification of the above embodiment. As illustrated in FIG. 16, the light receiving unit 9A of the second modification includes each one of the transfer electrode 11 (first transfer electrode), the transfer electrode 12 (second transfer electrode), a transfer electrode 51 (third transfer electrode), and a transfer electrode 52 (fourth transfer electrode). These transfer electrodes 11, 12, 51, and 52 are disposed around the photogate electrode 14 to be aligned with the photogate electrode 14. Incidentally, the photogate electrode 14 is positioned between the transfer electrode 11 and the transfer electrode 12 in the present embodiment, and the photogate electrode 14 is positioned between the transfer electrode 51 and the transfer electrode 52, but there is no restriction on a positional relationship among the transfer electrodes 11, 12, 51, and 52 as long as the transfer electrodes are aligned with the photogate electrode 14.

In addition, the light receiving unit 9A has each one of signal extraction electrodes 15, 16, 55, and 56. The transfer electrode 11 is disposed between the signal extraction electrode 15 and the photogate electrode 14, the transfer electrode 12 is disposed between the signal extraction electrode 16 and the photogate electrode 14, the transfer electrode 51 is disposed between the signal extraction electrode 55 and the photogate electrode 14, and the transfer electrode 52 is disposed between the signal extraction electrode 56 and the photogate electrode 14. In addition, the light receiving unit 9A has the transfer electrode 13 and the charge discharging electrode 17.

Figure 17:
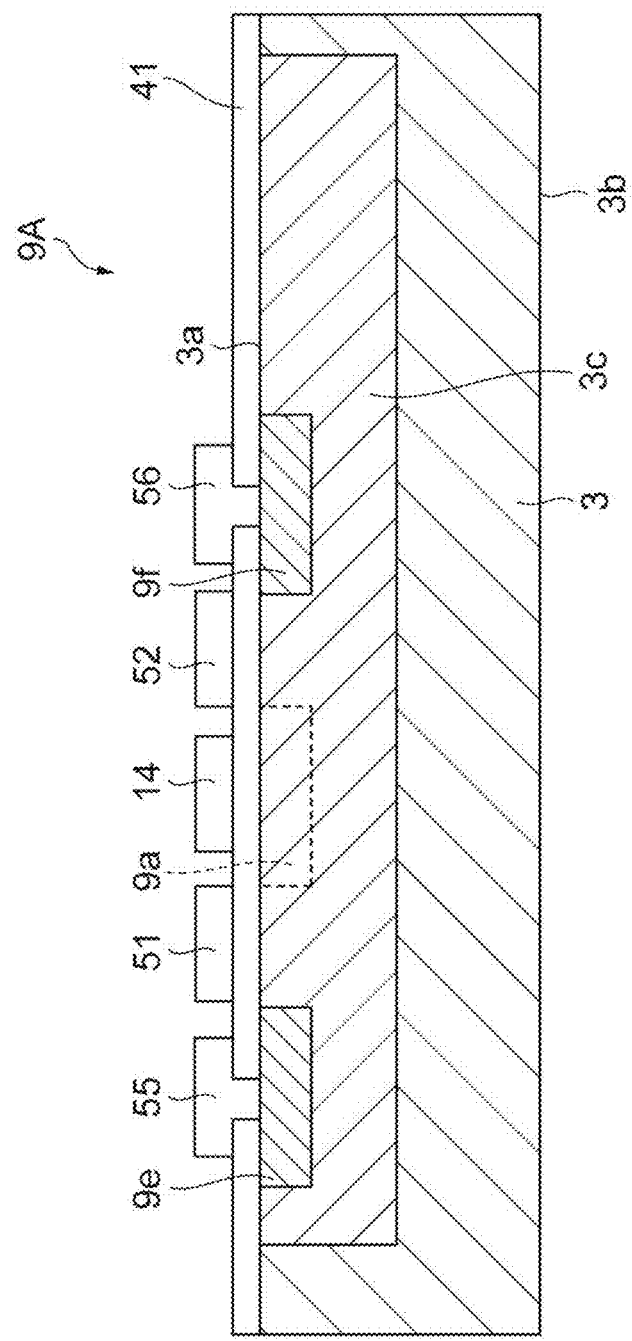
FIG. 17 is a cross-sectional view taken along a line XVII-XVII of FIG. 16.

In the light receiving unit 9A, a configuration immediately below the transfer electrodes 11 and 12 and the signal extraction electrodes 15 and 16 is the same as that in FIG. 3, and a configuration immediately below the transfer electrode 13 and the charge discharging electrode 17 is the same as that in FIG. 4. FIG. 17 is a cross-sectional view taken along a line XVII-XVII of FIG. 16, including a configuration immediately below the transfer electrodes 51 and 52 and the signal extraction electrodes 55 and 56. As illustrated in FIG. 17, the light receiving unit 9A further has a charge collection region 9e (third charge collection region), and a charge collection region 9f (fourth charge collection region). The charge collection regions 9e and 9f are disposed so as to be adjacent to the photosensitive region 9a in the state of sandwiching the photosensitive region 9a, collect charges from the photosensitive region 9a, and store the charges in storage nodes, respectively. Incidentally, configurations of the charge collection regions 9e and 9f are the same as those of the charge collection regions 9b and 9c illustrated in FIG. 3.

The signal extraction electrode 55 is formed on the charge collection region 9e, and the signal extraction electrode 56 is formed on the charge collection region 9f. The signal extraction electrodes 55 and 56 are in contact with the respective charge collection regions 9e and 9f, respectively, through openings formed in the insulating layer 41.

The transfer electrode 51 is disposed on a region between the photosensitive region 9a and the charge collection region 9e. The transfer electrode 52 is disposed on a region between the photosensitive region 9a and the charge collection region 9f. When a positive potential (on-potential) is applied to the transfer electrode 51, electrons fall from the photosensitive region 9a into a potential well of the charge collection region 9e (charges are stored in the well). Similarly, when a positive potential (on-potential) is applied to the transfer electrode 52, electrons fall from the photosensitive region 9a into a potential well of the charge collection region 9f.

Figure 18:
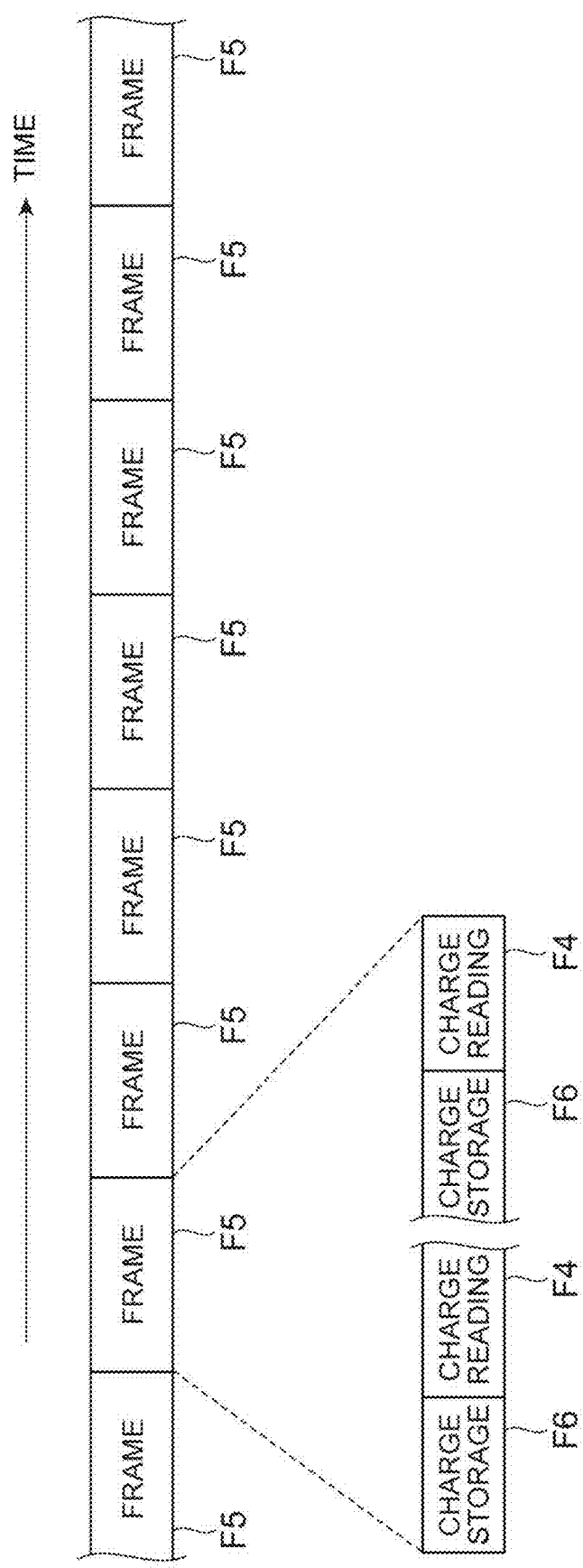
FIG. 18 is a view illustrating a driving system of a sensor drive circuit according to the second modification.

A sensor drive circuit of the second modification drives the transfer electrodes 11, 12, 51, and 52 by sequentially executing a plurality of time-divided frames. FIG. 18 is a view illustrating a driving system of the sensor drive circuit according to the second modification. As illustrated in FIG. 18, an identical frame F5 is repeated and processing in the frame F5 is performed in the driving system of the second modification. FIG. 18 also illustrates processing contents within the frame F5. Within the frame F5, a storage frame F6 to perform charge storage into storage nodes coupled, respectively, to the charge collection regions 9b, 9c, 9e, and 9f and a reading frame F4 to perform charge reading from the charge collection regions 9b, 9c, 9e, and 9f are alternately repeated.

Figure 19:
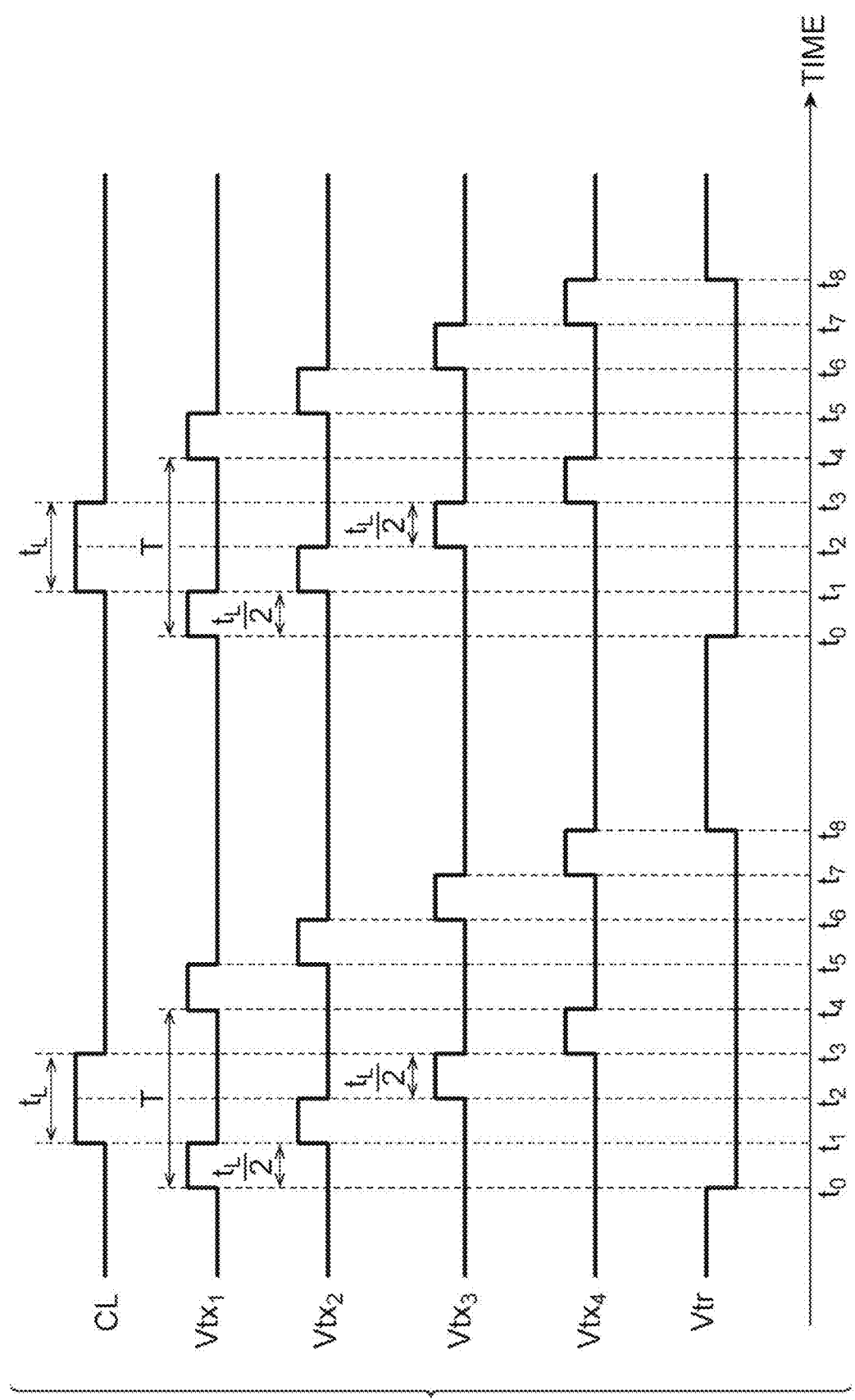
FIG. 19 is a timing chart illustrating an operation of a transfer electrode in a storage frame.

FIG. 19 is a timing chart illustrating operations of the transfer electrodes 11, 12, 13, 51, and 52 in the storage frame F6. FIG. 19 illustrates the driving clock CL, the drive voltage $Vtx_1$ applied to the transfer electrode 11, the drive voltage $Vtx_2$ applied to the transfer electrode 12, a drive voltage $Vtx_3$ applied to the transfer electrode 51, a drive voltage $Vtx_4$ applied to the transfer electrode 52, and the drive voltage Vtxr applied to the transfer electrode 13.

In the storage frame F6, the drive voltages $Vtx_1$ to $Vtx_4$ are repeatedly switched between the on-potential and the off-potential twice at a certain cycle T each time the driving clock CL rises once. The cycle T is set to twice an on-time $t_L$ of the driving clock CL (for example, $T=2t_L$). In addition, an on-time of the drive voltages $Vtx_1$ to $Vtx_2$ in each cycle is half of the on-time $t_L$ ($t_L/2$) of the driving clock CL.

Specifically, equally-spaced times $t_0$, $t_1$, ..., and $t_8$ are defined in the storage frame F6 of each of the frames F5 as illustrated in FIG. 19. An interval among these times is half of one-time irradiation time $t_L$ of the irradiation light L1. At this time, the light source unit 30 emits the irradiation light L for the times $t_1$ to $t_3$. Then, in each of the frames F5, the sensor drive circuit 7 sets the drive voltage $Vtx_1$ to the on-potential between the times $t_0$ and $t_1$ and between the times $t_4$ and $t_5$, the drive voltage $Vtx_2$ to the on-potential between the times $t_1$ and $t_2$ and between the times $t_5$ and $t_6$, the drive voltage $Vtx_3$ to the on-potential between the times $t_2$ and $t_3$ and between the times $t_6$ and $t_7$, and the drive voltage $Vtx_4$ to the on-potential between the times $t_3$ and $t_4$ and between the times $t_7$ and $t_8$ as illustrated in FIG. 19.

Incidentally, the drive voltage Vtxr applied to the transfer electrode 13 is set to the on-potential except for a period during which the other drive voltages $Vtx_1$ to $Vtx_4$ are initially set to the on-potential and then finally set to the off-potential. That is, in each of the frames F5, the drive voltage Vtxr is set to the off-potential between the times $t_0$ and $t_8$, and is set to the on-potential in the other periods.

The second modification is an example in which the first frame F1 and the second frame F2 of the first modification are collectively executed in the single frame F5. Therefore, a distance calculation method according to the second modification is the same as the distance calculation method of the first modification (see FIGS. 15A to 15C). That is, the output value of the first frame F of the first modification may be set as a value obtained by subtracting a charge amount of a storage node coupled to the charge collection region 9b from a charge amount of a storage node coupled to the charge collection region 9c in this second modification, and the output value of the second frame F2 of the first modification may be set as a value obtained by subtracting a charge amount of a storage node coupled to the charge collection region 9e from a charge amount of a storage node coupled to the charge collection region 9f in this second modification.

According to this second modification, it is possible to obtain a distance to the object B based on a difference between the charge amounts stored in the storage nodes coupled, respectively, to the charge collection regions 9b and 9c and a difference between the charge amounts stored in the storage nodes coupled, respectively, to the charge collection regions 9e and 9f similarly to the above embodiment. Therefore, it is possible to adopt the use method of injecting the equal amount of current to each storage node, and as a result, it is possible to avoid saturation of each storage node. In addition, it is also possible to suitably achieve the other effects of the above embodiment.

In addition, the sensor drive circuit 7 may drive the transfer electrode 13 in each of the frames F5 as described above in the second modification. As a result, it is possible to further suppress saturation caused by disturbance light and reduce shot noise caused by the disturbance light, and thus, it is possible to improve a resistance against the disturbance light and distance measurement accuracy.

The distance sensor and the method for driving the distance sensor according to the present invention are not limited to the above embodiments, and other various modifications can be made. For example, the case where each transistor of the sensor drive circuit is the MOSFET has been exemplified in the above embodiment, but each transistor may be another FET or a bipolar transistor.

REFERENCE SIGNS LIST 1A distance sensor; 3 . . . semiconductor substrate; 5 . . . imaging region; 7 . . . sensor drive circuit; 8 . . . processing circuit; 9, 9A . . . light receiving unit; 9a . . . photosensitive region; 9b to 9f . . . charge collection region; 11, 12, 13, 51, 52 . . . transfer electrode; 14 . . . photogate electrode; 15, 16, 55, 56 . . . signal extraction electrode; 17 . . . charge discharging electrode; 20 . . . current injection circuit; 21 . . . voltage generation circuit; 25 . . . current source; 26a, 26b . . . storage node; 27, 28 . . . buffer circuit; 30 . . . light source unit; 31 . . . light source; 32 . . . light source drive circuit; 33 . . . control circuit; 34 . . . power supply potential line; 35, 36 . . . reset circuit; 41 . . . insulating layer; B . . . object; CL . . . driving clock; F1 . . . first frame; F2 . . . second frame; F3, F6 . . . storage frame; F4 . . . read frame; F5 . . . frame; GND . . . reference potential line; L1 . . . irradiation light; L2 . . . reflected light; $N_1$ . . . node; P . . . pixel; and $Vtx_1$ to $Vtx_4$ . . . drive voltage.

The invention claimed is:

1. A distance sensor configured to irradiate an object with light and measure a distance to the object by detecting reflected light from the object, the distance sensor comprising:
a light irradiation unit configured to repeatedly irradiate the object with the light in a pulsed state;
a semiconductor substrate having a photosensitive region generating charges corresponding to a light amount of the reflected light, and first and second charge collection regions each collecting the charges from the photosensitive region, the first and second charge collection regions disposed in a state of being spaced apart from the photosensitive region by a predetermined distance;
a first transfer electrode disposed on a region between the photosensitive region and the first charge collection region, the first transfer electrode being settable to an on-potential configured to enable charge transfer from the photosensitive region to the first charge collection region or an off-potential configured to stop the charge transfer;
a second transfer electrode disposed on a region between the photosensitive region and the second charge collection region, the second transfer electrode being settable to an on-potential configured to enable charge transfer from the photosensitive region to the second charge collection region or an off-potential configured to stop the charge transfer; and
a drive unit configured to sequentially execute a plurality of frames, each of which forms an electrode drive pattern for driving the first and second transfer electrodes and is defined by equally-spaced times $t_0$, $t_1$, . . . , and $t_9$, to drive the first and second transfer electrodes,
wherein the light irradiation unit emits the light for the times $t_1$ to $t_3$ in each of the plurality of frames,
the drive unit, in a first frame among the plurality of frames, sets the first transfer electrode to the on-potential between the times $t_0$ and $t_2$ and between the times $t_4$ and $t_6$, while setting the second transfer electrode to the on-potential between the times $t_2$ and $t_4$ and between the times $t_6$ and $t_8$, and
the drive unit, in a second frame different from the first frame, sets the first transfer electrode to the on-potential between the times $t_1$ and $t_3$ and between the times $t_5$ and $t_7$, while setting the second transfer electrode to the on-potential between the times $t_3$ and $t_5$ and between the times $t_7$ and $t_9$.

2. The distance sensor according to claim 1, further comprising a fifth transfer electrode disposed on a region between the photosensitive region and a fifth charge collection region,
wherein the semiconductor substrate further has the fifth charge collection region disposed in a state of being spaced apart from the photosensitive region by a predetermined distance and collecting the charges from the photosensitive region, and
the drive unit sets the fifth transfer electrode to an on-potential except for a period during which other transfer electrodes are initially set to the on-potential and then finally set to the off-potential.

3. A distance sensor configured to irradiate an object with light and measure a distance to the object by detecting reflected light from the object, the distance sensor comprising:
a light irradiation unit configured to repeatedly irradiate the object with the light in a pulsed state;
a semiconductor substrate having a photosensitive region generating charges corresponding to a light amount of the reflected light, and first and second charge collection regions each collecting the charges from the photosensitive region, the firdst and second charge collection regions disposed in a state of being spaced apart from the photosensitive region by a predetermined distance;
a first transfer electrode disposed on a region between the photosensitive region and the first charge collection region, the first transfer electrode being settable to an on-potential configured to enable charge transfer from the photosensitive region to the first charge collection region or an off-potential configured to stop the charge transfer;
a second transfer electrode disposed on a region between the photosensitive region and the second charge collection region, the second transfer electrode being settable to an on-potential configured to enable charge transfer from the photosensitive region to the second charge collection region or an off-potential configured to stop the charge transfer; and
a drive unit configured to sequentially execute a plurality of frames, each of which forms an electrode drive pattern for driving the first and second transfer electrodes and is defined by equally-spaced times $t_0$, $t_1, \ldots,$ and $t_8$, to drive the first and second transfer electrodes, wherein the light irradiation unit emits the light for the times $t_1$ to $t_3$ in each of the plurality of frames, the drive unit, in a first frame among the plurality of frames, sets the first transfer electrode to the on-potential between the times $t_0$ and $t_1$ and between the times $t_4$ and $t_5$, while setting the second transfer electrode to the on-potential between the times $t_2$ and $t_3$ and between the times $t_6$ and $t_7$, and the drive unit, in a second frame different from the first frame, sets the first transfer electrode to the on-potential between the times $t_1$ and $t_2$ and between the times $t_5$ and $t_6$, while setting the second transfer electrode to the on-potential between the times $t_3$ and $t_4$ and between the times $t_7$ and $t_8$.

4. The distance sensor according to claim 3, further comprising a fifth transfer electrode disposed on a region between the photosensitive region and a fifth charge collection region, wherein the semiconductor substrate further has the fifth charge collection region disposed in a state of being spaced apart from the photosensitive region by a predetermined distance and collecting the charges from the photosensitive region, and the drive unit sets the fifth transfer electrode to an on-potential except for a period during which other transfer electrodes are initially set to the on-potential and then finally set to the off-potential.

5. A distance sensor configured to irradiate an object with light and measure a distance to the object by detecting reflected light from the object, the distance sensor comprising:

a light irradiation unit configured to repeatedly irradiate the object with the light in a pulsed state;

a semiconductor substrate having a photosensitive region generating charges corresponding to a light amount of the reflected light, and first to fourth charge collection regions each collecting the charges from the photosensitive region, the first to fourth charge collection regions disposed in a state of being spaced apart from the photosensitive region by a predetermined distance;

a first transfer electrode disposed on a region between the photosensitive region and the first charge collection region, the first reansfer electrode being settable to an on-potential configured to enable charge transfer from the photosensitive region to the first charge collection region or an off-potential configured to stop the charge transfer;

a second transfer electrode disposed on a region between the photosensitive region and the second charge collection region, the second transfer electrode being settable to an on-potential configured to enable charge transfer from the photosensitive region to the second charge collection region or an off-potential configured to stop the charge transfer;

a third transfer electrode disposed on a region between the photosensitive region and the third charge collection region, the third transfer electrode being settable to an on-potential configured to enable charge transfer from the photosensitive region to the third charge collection region or an off-potential configured to stop the charge transfer;

a fourth transfer electrode disposed on a region between the photosensitive region and the fourth charge collection region, the fourth transfer electrode being settable to an on-potential configured to enable charge transfer from the photosensitive region to the fourth charge collection region or an off-potential configured to stop the charge transfer; and a drive unit configured to sequentially execute a plurality of frames, each of which forms an electrode drive pattern for driving the first to fourth transfer electrodes and is defined by equally-spaced times $t_0, t_1, \ldots,$ and $t_8$, to drive the first to fourth transfer electrodes, wherein the light irradiation unit emits the light for the times $t_1$ to $t_3$ in each of the plurality of frames, and the drive unit, in each of the plurality of frames, sets the first transfer electrode to the on-potential between the times $t_0$ and $t_1$ and between the times $t_4$ and $t_5$, sets the second transfer electrode to the on-potential between the times $t_1$ and $t_2$ and between the times $t_5$ and $t_6$, sets the third transfer electrode to the on-potential between the times $t_2$ and $t_3$ and between the times $t_6$ and $t_7$, and sets the fourth transfer electrode to the on-potential between the times $t_3$ and $t_4$ and between the times $t_7$ and $t_8$.

6. The distance sensor according to claim 5, further comprising a fifth transfer electrode disposed on a region between the photosensitive region and a fifth charge collection region, wherein the semiconductor substrate further has the fifth charge collection region disposed in a state of being spaced apart from the photosensitive region by a predetermined distance and collecting the charges from the photosensitive region, and the drive unit sets the fifth transfer electrode to an on-potential except for a period during which other transfer electrodes are initially set to the on-potential and then finally set to the off-potential.

7. A driving method for a distance sensor configured to irradiate an object with light and measure a distance to the object by detecting reflected light from the object, the distance sensor comprising:

a light irradiation unit configured to repeatedly irradiate the object with the light in a pulsed state;

a semiconductor substrate having a photosensitive region generating charges corresponding to a light amount of the reflected light, and first and second charge collection regions each collecting the charges from the photosensitive region, the first and second chage collection regions disposed in a state of being spaced apart from the photosensitive region by a predetermined distance;

a first transfer electrode disposed on a region between the photosensitive region and the first charge collection region, the first transfer electrode being settable to an on-potential configured to enable charge transfer from the photosensitive region to the first charge collection region or an off-potential configured to stop the charge transfer; and a second transfer electrode disposed on a region between the photosensitive region and the second charge collection region, the second transfer electrode being settable to an on-potential configured to enable charge transfer from the photosensitive region to the second charge collection region or an off-potential configured to stop the charge transfer, the driving method, sequentially executing a plurality of frames each of which forms an electrode drive pattern for driving the first and second transfer electrodes and is defined by equally-spaced times $t_0, t_1, \ldots,$ and $t_9$, comprising:

emitting the light from the light irradiation unit for the times $t_1$ to $t_3$ in each of the plurality of frames;

setting the first transfer electrode to the on-potential between the times $t_0$ and $t_2$ and between the times $t_4$ and $t_6$, while setting the second transfer electrode to the on-potential between the times $t_2$ and $t_4$ and between the times $t_6$ and $t_8$, in a first frame among the plurality of frames; and setting the first transfer electrode to the on-potential between the times $t_1$ and $t_3$ and between the times $t_5$ and $t_7$, while setting the second transfer electrode to the on-potential between the times $t_3$ and $t_5$ and between the times $t_7$ and $t_9$, in a second frame different from the first frame.

8. The driving method for the distance sensor according to claim 7, wherein the semiconductor substrate further has a fifth charge collection region disposed in a state of being spaced apart from the photosensitive region by a predetermined distance and collecting the charges from the photosensitive region, the distance sensor further comprises a fifth transfer electrode disposed on a region between the photosensitive region and the fifth charge collection region, and the fifth transfer electrode is set to an on-potential except for a period during which other transfer electrodes are initially set to the on-potential and then finally set to the off-potential.

9. A driving method for a distance sensor configured to irradiate an object with light and measure a distance to the object by detecting reflected light from the object, the distance sensor comprising:

a light irradiation unit configured to repeatedly irradiate the object with the light in a pulsed state;

a semiconductor substrate having a photosensitive region generating charges corresponding to a light amount of the reflected light, and first and second charge collection regions each collecting the charges from the photosensitive region, the first and second charge collection regions disposed in a state of being spaced apart from the photosensitive region by a predetermined distance;

a first transfer electrode disposed on a region between the photosensitive region and the first charge collection region, the first transfer electrode being settable to an on-potential configured to enable charge transfer from the photosensitive region to the first charge collection region or an off-potential configured to stop the charge transfer; and a second transfer electrode disposed on a region between the photosensitive region and the second charge collection region, the second transfer electrode being settable to an on-potential configured to enable charge transfer from the photosensitive region to the second charge collection region or an off-potential configured to stop the charge transfer, the driving method, sequentially executing a plurality of frames each of which forms an electrode drive pattern for driving the first and second transfer electrodes and is defined by equally-spaced times $t_0, t_1, \ldots,$ and $t_8$, comprising:

emitting the light from the light irradiation unit for the times $t_1$ to $t_3$ in each of the plurality of frames;

setting the first transfer electrode to the on-potential between the times $t_0$ and $t_1$ and between the times $t_4$ and $t_5$, while setting the second transfer electrode to the on-potential between the times $t_2$ and $t_3$ and between the times $t_6$ and $t_7$, in a first frame among the plurality of frames; and setting the first transfer electrode to the on-potential between the times $t_1$ and $t_2$ and between the times $t_5$ and $t_6$, while setting the second transfer electrode to the on-potential between the times $t_3$ and $t_4$ and between the times $t_7$ and $t_8$, in a second frame different from the first frame.

10. The method for driving the distance sensor according to claim 9, wherein the semiconductor substrate further has a fifth charge collection region disposed in a state of being spaced apart from the photosensitive region by a predetermined distance and collecting the charges from the photosensitive region, the distance sensor further comprises a fifth transfer electrode disposed on a region between the photosensitive region and the fifth charge collection region, and the fifth transfer electrode is set to an on-potential except for a period during which other transfer electrodes are initially set to the on-potential and then finally set to the off-potential.

11. A driving method for a distance sensor configured to irradiate an object with light and measure a distance to the object by detecting reflected light from the object, the distance sensor comprising:

a light irradiation unit configured to repeatedly irradiate the object with the light in a pulsed state;

a semiconductor substrate having a photosensitive region generating charges corresponding to a light amount of the reflected light, and first to fourth charge collection regions each collecting the charges from the photosensitive region, the first to fourth charge collection regions disposed in a state of being spaced apart from the photosensitive region by a predetermined distance;

a first transfer electrode disposed on a region between the photosensitive region and the first charge collection region, the first transfer electrode being settable to an on-potential configured to enable charge transfer from the photosensitive region to the first charge collection region or an off-potential configured to stop the charge transfer; and a second transfer electrode disposed on a region between the photosensitive region and the second charge collection region, the second transfer electrode being settable to an on-potential configured to enable charge transfer from the photosensitive region to the second charge collection region or an off-potential configured to stop the charge transfer;

a third transfer electrode disposed on a region between the photosensitive region and the third charge collection region, the third transfer electrode being settable to an on-potential configured to enable charge transfer from the photosensitive region to the third charge collection region or an off-potential configured to stop the charge transfer; and a fourth transfer electrode disposed on a region between the photosensitive region and the fourth charge collection region, the fourth transfer electrode being settable to an on-potential configured to enable charge transfer from the photosensitive region to the fourth charge collection region or an off-potential configured to stop the charge transfer, the driving method, sequentially executing a plurality of frames, each of which forms an electrode drive pattern for driving the first and fourth transfer electrodes and is defined by equally-spaced times $t_0, t_1, \ldots,$ and $t_8$, comprising:

emitting the light from the light irradiation unit for the times $t_1$ to $t_3$;

setting the first transfer electrode to the on-potential between the times $t_0$ and $t_1$ and between the times $t_4$ and $t_5$;

setting the second transfer electrode to the on-potential between the times $t_1$ and $t_2$ and between the times $t_5$ and $t_6$;

setting the third transfer electrode to the on-potential between the times $t_2$ and $t_3$ and between the times $t_6$ and $t_7$; and setting the fourth transfer electrode to the on-potential between the times $t_3$ and $t_4$ and between the times $t_7$ and $t_8$.

12. The method for driving the distance sensor according to claim 11, wherein the semiconductor substrate further has a fifth charge collection region disposed in a state of being spaced apart from the photosensitive region by a predetermined distance and collecting the charges from the photosensitive region, the distance sensor further comprises a fifth transfer electrode disposed on a region between the photosensitive region and the fifth charge collection region, and the fifth transfer electrode is set to an on-potential except for a period during which other transfer electrodes are initially set to the on-potential and then finally set to the off-potential.

* * * * *